US012635205B2

(12) United States Patent
Yanagihara et al.

(10) Patent No.: US 12,635,205 B2
(45) Date of Patent: May 19, 2026

(54) NITRIDE SEMICONDUCTOR DEVICE

(71) Applicant: Panasonic Intellectual Property Management Co., Ltd., Osaka (JP)

(72) Inventors: Manabu Yanagihara, Osaka (JP); Masayuki Kuroda, Osaka (JP); Hiroto Yamagiwa, Hyogo (JP); Hideyuki Okita, Osaka (JP); Masahiro Hikita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 458 days.

(21) Appl. No.: 18/246,280

(22) PCT Filed: Aug. 16, 2021

(86) PCT No.: PCT/JP2021/029951
§ 371 (c)(1),
(2) Date: Mar. 22, 2023

(87) PCT Pub. No.: WO2022/079995
PCT Pub. Date: Apr. 21, 2022

(65) Prior Publication Data
US 2023/0361179 A1 Nov. 9, 2023

(30) Foreign Application Priority Data
Oct. 16, 2020 (JP) ................................. 2020-174945

(51) Int. Cl.
*H10D 62/85* (2025.01)
*H10D 8/00* (2025.01)
(Continued)

(52) U.S. Cl.
CPC ........... *H10D 62/8503* (2025.01); *H10D 8/25* (2025.01); *H10D 8/422* (2025.01); *H10D 64/258* (2025.01); *H10W 20/20* (2026.01)

(58) Field of Classification Search
CPC ............. H10D 62/8503; H10D 64/258; H10D 30/475; H10D 64/411; H10D 64/27;
(Continued)

(56) References Cited

U.S. PATENT DOCUMENTS

2008/0149940 A1 6/2008 Shibata et al.
2014/0103537 A1 4/2014 Kaibara
(Continued)

FOREIGN PATENT DOCUMENTS

JP 2008-177527 A 7/2008
JP 2009123932 A * 6/2009
WO 2012/176399 A1 12/2012

OTHER PUBLICATIONS

International Search Report issued on Nov. 2, 2021 in International Patent Application No. PCT/JP2021/029951, with English translation.

*Primary Examiner* — Shahed Ahmed
(74) *Attorney, Agent, or Firm* — Rimon P.C.

(57) ABSTRACT

A nitride semiconductor device includes: a first active area surrounded by an isolation area; and the following electrodes above the first active area: a source electrode; a first gate electrode and a second gate electrode, one on either side of and spaced from the source electrode in a first direction in plan view; and at least one drain electrode located in a direction opposite the source electrode relative to the first gate electrode or the second gate electrode. The source electrode, the first gate electrode, the second gate electrode, and the at least one drain electrode each include a finger-shaped portion extending in a second direction perpendicular to the first direction in the plan view. A first dielectric film
(Continued)

is disposed above the source electrode. The first gate elec-
trode and the second gate electrode are electrically con-
nected by a gate electrode joiner disposed above the first
dielectric film.

16 Claims, 13 Drawing Sheets

(51) Int. Cl.
*H10D 8/25*         (2025.01)
*H10D 64/23*       (2025.01)
*H10W 20/20*      (2026.01)

(58) Field of Classification Search
CPC ................. H10D 64/23; H10D 64/257; H10D
30/47–485; H10D 30/015; H10D
84/0135–0142; H10D 84/0172–0179;
H01L 23/481
See application file for complete search history.

(56)               References Cited

U.S. PATENT DOCUMENTS

2020/0335493 A1 * 10/2020 Arnold ................... H10D 84/84
2021/0273065 A1 * 9/2021 Brun .................... H10D 64/411

\* cited by examiner

NITRIDE SEMICONDUCTOR DEVICE

CROSS-REFERENCE OF RELATED APPLICATIONS

This application is the U.S. National Phase under 35 U.S.C. § 371 of International Patent Application No. PCT/JP2021/029951, filed on Aug. 16, 2021, which in turn claims the benefit of Japanese Patent Application No. 2020-174945, filed on Oct. 16, 2020, the entire disclosures of which Applications are incorporated by reference herein.

TECHNICAL FIELD

The present disclosure relates to a nitride semiconductor device that uses a nitride semiconductor such as gallium nitride (GaN) as a semiconductor material.

BACKGROUND ART

As power transistors for switching, commercialization of field-effect transistors using GAN, a nitride semiconductor, (GaN-FET) has been in progress in recent years. As GaN-FETs, a typical configuration is as follows: a configuration that includes a GaN layer as a channel layer and AlGaN as a barrier layer which are formed above a semiconductor substrate, and uses, as a channel, two-dimensional electron gas that is produced by spontaneous polarization and piezo-electric polarization at an interface of a heterojunction between the foregoing two layers.

In GaN-FETs having the above-described configuration, a channel current flows in a direction parallel to a base. As a result, a source pad, a drain pad, and a gate pad, which supply a voltage to an FET from outside or cause a current to flow through the FET via wire bonding, are all formed on a surface side of the base. Accordingly, it is important to reduce a proportion of a pad area relative to the whole chip area for reducing the cost of a GaN-FET by a reduction in the chip area.

In order to reduce a pad area as described above, a technique called a pad on element (POE) technique or a pad over active (POA) technique has been developed (see Patent Literature (PTL) 1 and PTL 2). In the above-described technique, each of pads is disposed above an area (active area) in which an FET is actually performing transistor operation. Since the use of the above-described technique does not increase a chip area due to pads, the above described-technique is extremely effective in reducing the chip area.

CITATION LIST

Patent Literature

[PTL 1] Japanese Unexamined Patent Application Publication No. 2008-177527
[PTL 2] International Publication No. 2012/176399

SUMMARY OF INVENTION

Technical Problem

However, in a wiring technique implementing the POE technique in conventional nitride semiconductor devices, a wiring of gate electrodes had been formed in an isolation area outside an active area. As is stated by PTL 2 in paragraph [0038], "[t]he gate electrodes 8 are tied in a bundle outside the active region, and the bundle of the gate electrodes 8 bypasses the outer periphery of the active region to be connected to the gate electrode pad layer 23." This results in an increase in the length of a wiring of gate electrodes up to a gate pad as the number of unit transistors included in a power transistor increases for producing higher power. In this case, fast switching cannot be performed since the resistance of a gate wiring is increased. In other words, a wiring technique for gate electrodes can be improved upon.

In view of the above problem, the present disclosure mainly aims to provide a nitride semiconductor device suitable for fast switching operation by reducing the resistance of a gate wiring. The resistance of a gate wiring is to be reduced as a result of forming a wiring of a gate electrode above an active area to shorten the length of the wiring up to a gate electrode pad.

Other problems and new features will be described based on the specification and drawings.

Solution to Problem

In order to provide the above-described nitride semiconductor device, a nitride semiconductor device according to one aspect of the present disclosure includes: a base; a semiconductor stacked structure above the base, the semiconductor stacked structure including a plurality of nitride semiconductor layers; a first active area on a top surface side of the semiconductor stacked structure, the first active area being surrounded by an isolation area; and the following electrodes above the first active area: (i) a source electrode; (ii) a first gate electrode and a second gate electrode, one on either side of and spaced from the source electrode in a first direction in plan view; and (iii) at least one drain electrode located in a direction opposite the source electrode relative to the first gate electrode or the second gate electrode. The source electrode, the first gate electrode, the second gate electrode, and the at least one drain electrode each include a finger-shaped portion extending in a second direction perpendicular to the first direction in the plan view. A first dielectric film is disposed above the source electrode. The first gate electrode and the second gate electrode are electrically connected by a gate electrode joiner disposed above the first dielectric film.

Moreover, in order to provide the above-described nitride semiconductor device, a nitride semiconductor device according to another aspect of the present disclosure includes: a base; a semiconductor stacked structure above the base, the semiconductor stacked structure including a plurality of nitride semiconductor layers; a first active area on a top surface side of the semiconductor stacked structure, the first active area being surrounded by an isolation area; and the following electrodes above the first active area: (i) a first source electrode; and (ii) a first gate electrode and a second gate electrode, one on either side of and spaced from the first source electrode in a first direction in plan view; and (iii) a second source electrode; and (iv) a third gate electrode and a fourth gate electrode, one on either side of and spaced from the second source electrode in the first direction in the plan view. The first source electrode, the first gate electrode, the second gate electrode, the second source electrode, the third gate electrode, and the fourth gate electrode each include a finger-shaped portion extending in a second direction perpendicular to the first direction in the plan view. A first dielectric film is disposed above the first source electrode and the second source electrode. The first gate electrode and the second gate electrode are electrically connected by a first gate electrode joiner disposed above the first dielectric film. The third gate electrode and the fourth gate electrode are electrically connected by a second gate electrode joiner disposed above the first dielectric film.

Advantageous Effects of Invention

The present disclosure provides a nitride semiconductor device that can reduce the resistance of a gate wiring.

BRIEF DESCRIPTION OF DRAWINGS

FIG. 1 is a plan view of a nitride semiconductor device according to Embodiment 1.

FIG. 9 is a plan view of a nitride semiconductor device according to Embodiment 3.

DESCRIPTION OF EMBODIMENTS

Hereinafter, embodiments will be described in detail with reference to the drawings. Note that the embodiments below each describe a general or specific example. The numerical values, shapes, materials, structural elements, the arrangement and connection of the structural elements, and the like described in the following embodiments are mere examples, and thus are not intended to limit the present disclosure. Moreover, the embodiments of the present disclosure are not limited by the present independent claims. These embodiments may be implemented by other independent claims.

Embodiment 1

Figure 1:
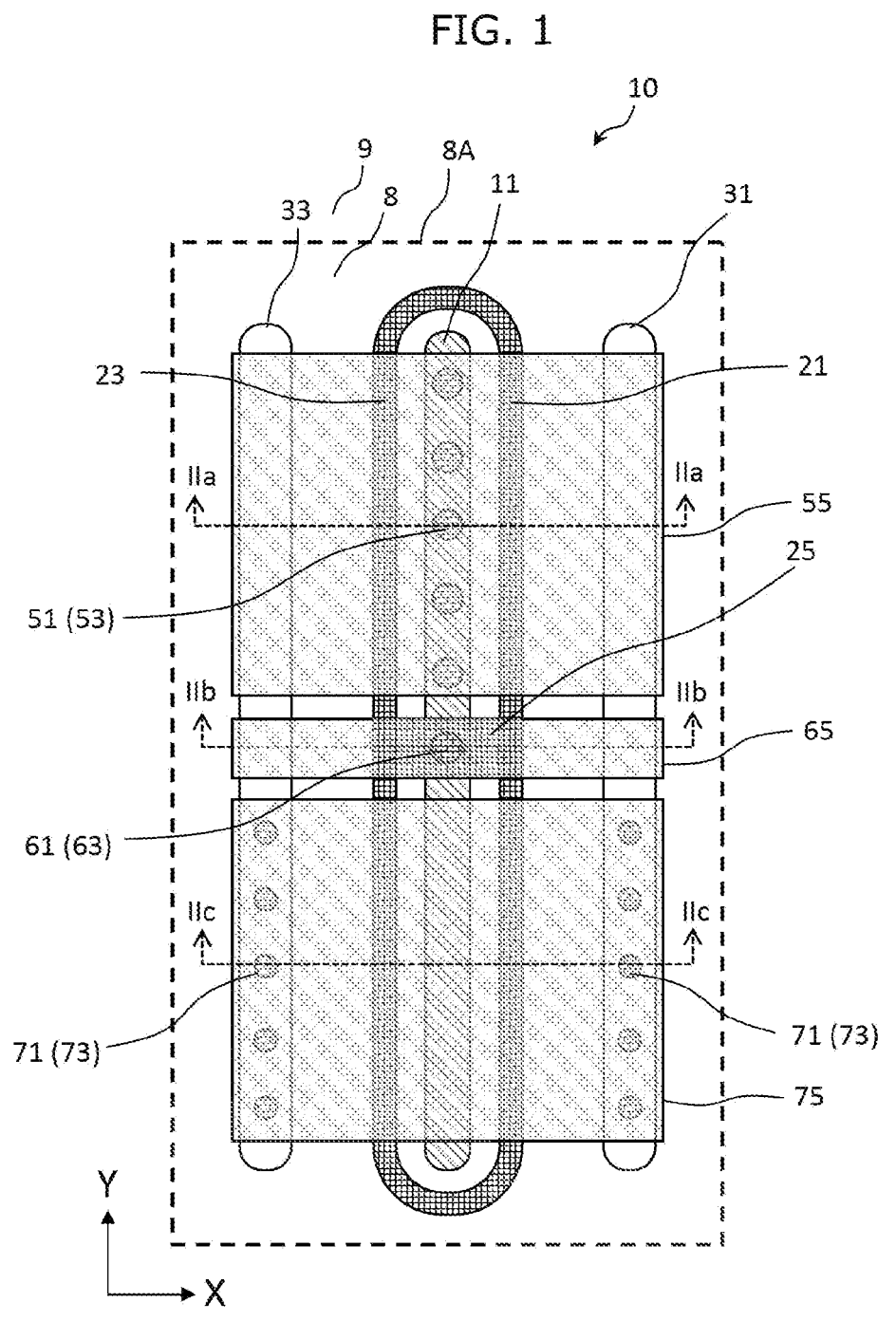
Figure 2A:
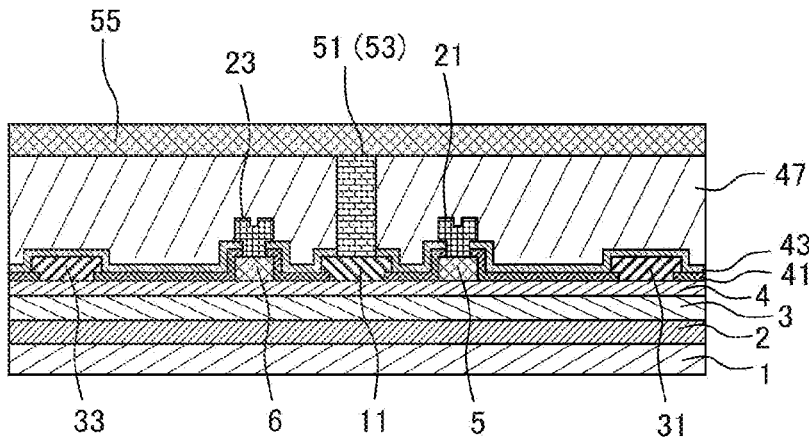
FIG. 2A is a cross-sectional view of the nitride semiconductor device according to Embodiment 1 which is taken along line IIa-IIa shown in FIG. 1.
Figure 2B:
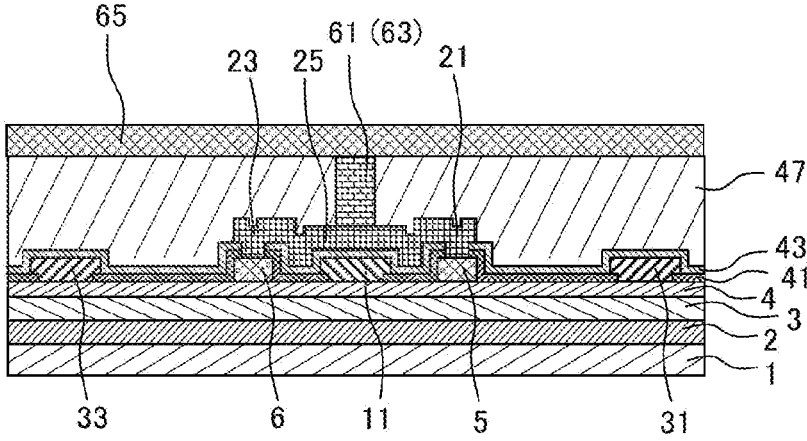
FIG. 2B is a cross-sectional view of the nitride semiconductor device according to Embodiment 1 which is taken along line IIb-IIb shown in FIG. 1.
Figure 2C:
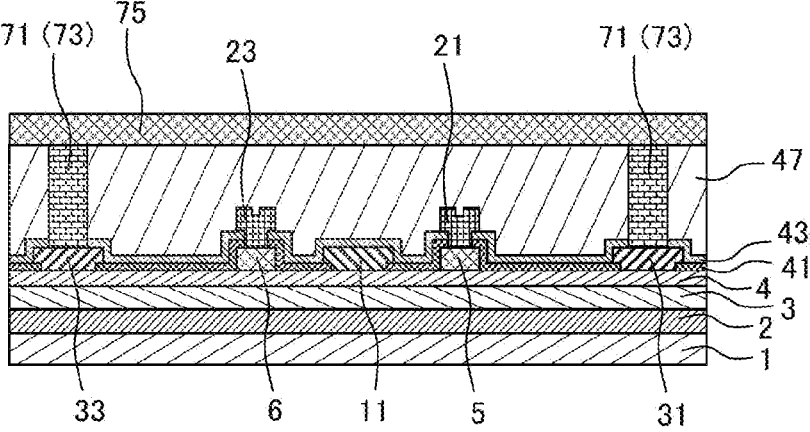
FIG. 2C is a cross-sectional view of the nitride semiconductor device according to Embodiment 1 which is taken along line IIc-IIc shown in FIG. 1.

FIG. 1 illustrates a plan view of nitride semiconductor device 10 according to Embodiment 1. FIG. 2A, FIG. 2B, and FIG. 2C illustrate cross-sectional views of nitride semiconductor device 10 taken along line IIa-IIa, line IIb-IIb, and line IIc-IIc shown in FIG. 1, respectively.

As illustrated in FIG. 2A, FIG. 2B, and FIG. 2C, buffer layer 2 including an AlN layer and an AlGaN layer, GaN channel layer 3, and AlGaN barrier layer 4 are formed above Si base 1 as a semiconductor stacked structure through epitaxial growth. P-type GaN layer 5 and p-type GaN layer 6 that have been epitaxially grown and etched thereafter are formed above AlGaN barrier layer 4. Highly-concentrated two-dimensional electron gas is produced at the interface between GaN channel layer 3 and AlGaN barrier layer 4, resulting from the effects of piezoelectric polarization and spontaneous polarization. An area in which the above-described two-dimensional electron gas is produced is first active area 8 illustrated in FIG. 1, and an area made highly resistant to the two-dimensional electron gas by means of ion implantation is isolation area 9. The boundary between first active area 8 and isolation area 9 is ion implanted area boundary 8A. Note that isolation area 9 may be formed by removing an area containing two-dimensional electron gas through a mesa etching process.

As illustrated in FIG. 2A, FIG. 2B, and FIG. 2C, SiN film 41 is formed on the surfaces of AlGaN barrier layer 4, p-type GaN layer 5, and p-type GaN layer 6 as a surface protection film. Source electrode 11, drain electrode 31, and drain electrode 33 are formed by making openings in SiN film 41. As first dielectric film 43, a SiO film is further formed above SiN film 41. First gate electrode 21 and second gate electrode 23 are formed above p-type GaN layer 5 and p-type GaN layer 6, respectively, by making openings in SiN film 41 and first dielectric film 43.

As illustrated in FIG. 1, first gate electrode 21 and second gate electrode 23 are formed on respective sides of and spaced from the finger-shaped source electrode 11 in a first direction in plan view.

Here, the first direction is the X direction in FIG. 1. Furthermore, the finger-shaped drain electrode 31 is located in a direction opposite source electrode 11 relative to first gate electrode 21, and the finger-shaped drain electrode 33 is located in a direction opposite source electrode 11 relative to second gate electrode 23. Moreover, first gate electrode 21 and second gate electrode 23 extend in the shape of a finger in a second direction perpendicular to the first direction together with p-type GaN layer 5 and p-type GaN layer 6 disposed below first gate electrode 21 and second gate electrode 23, respectively, and are connected at the two end portions each in the shape of an arc. Here, the second direction is the Y direction in FIG. 1. The above-described configuration reduces leak currents that flow between source electrode 11 and drain electrode 31 and between source electrode 11 and drain electrode 33 during an OFF state. Note that when first gate electrode 21 and second gate electrode 23 are not connected at the end portions, these finger-shaped gate electrodes need to reach isolation area 9 across ion implanted area boundary 8A.

As illustrated in FIG. 2B, first gate electrode 21 and second gate electrode 23 are combined by gate electrode joiner 25 at the center portion between first gate electrode 21 and second gate electrode 23. This gate electrode joiner 25 includes the same metal layer as first gate electrode 21 and second gate electrode 23, and is simultaneously formed with first gate electrode 21 and second gate electrode 23. For this reason, there is no increase in the number of manufacturing processes. However, whereas first gate electrode 21 and second gate electrode 23 are in contact with p-type GaN layer 5 and p-type GaN layer 6, respectively, gate electrode joiner 25 is formed above the SiO film that is first dielectric film 43, and thus is electrically insulated from source electrode 11. Moreover, the width (the depth direction in plan view) of gate electrode joiner 25 is about 3 μm, and is designed greater than first gate electrode 21 and second gate electrode 23 both of which have lengths of about 1 μm. With this design, it is possible to perform a wiring process using vias and plugs which is difficult to perform above gate electrodes. The above-mentioned wiring process will be hereinafter described.

As illustrated in FIG. 2A, FIG. 2B, and FIG. 2C, a SiO film that is second dielectric film 47 is formed above first gate electrode 21, second gate electrode 23, gate electrode joiner 25, source electrode 11, drain electrode 31, and drain electrode 33. In a high voltage transistor, second dielectric film 47 is to be designed to have a thickness that can prevent an occurrence of a dielectric breakdown between the source and a drain. For example, when second dielectric film 47 is used as a SiO film in a transistor withstanding 600 V, the thickness of the film is to range from 2 μm to 3 μm. In this case, vias 51 above source electrode 11, via 61 above gate electrode joiner 25, and vias 71 above drain electrodes 31 and 33 are formed by using a usual photolithography technique and a technique for dry etching second dielectric film 47 and first dielectric film 43, if source electrode 11, gate electrode joiner 25, and drain electrode 31 each have a width of about 3 μm. Plugs 53, 63, and 73 that fill the above-described vias are then formed. Plugs 53, 63, and 73 each have a portion in contact with second dielectric film 47 where a TiN film is formed as a barrier layer, and tungsten (W) is used for these plugs. Plugs 53 are connected with first source lead wiring 55, plug 63 is connected to first gate lead wiring 65, and plugs 73 are connected to first drain lead wiring 75.

In this embodiment, first gate electrode 21 and second gate electrode 23 are connected by gate electrode joiner 25 at the center portion between first gate electrode 21 and second gate electrode 23. Moreover, a gate wiring is formed by forming via 61 in gate electrode joiner 25. Accordingly, the resistance of the gate wiring is significantly reduced as compared to the case where a gate wiring is formed from end portions of gate electrodes. A reduction in the resistance of the gate wiring renders nitride semiconductor device 10 suitable for fast switching operation.

In addition, the gate wiring is formed, not above isolation area 9, but above first active area 8. This also results in no increase in a chip area. Furthermore, capacitance due to first dielectric film 43 is generated between source electrode 11 and gate electrode joiner 25. This capacitance is capacitance between the gates and the source. In order to prevent a power transistor for switching from being erroneously turned ON, it is desirable to increase capacitance between the gates and the source relative to capacitance between the gates and the drains. Accordingly, the use of this embodiment can implement a power transistor for switching that has a large capacitance between the gates and the source, and thus is capable of preventing the power transistor from being erroneously turned ON.

Note that although W is used as the plugs that fill the vias in nitride semiconductor device 10 according to the embodiment, aluminum (Al) and copper (Cu) may be used. When Cu is used, a dual-damascene method may be employed to simultaneously form a plug and a wiring connected thereto.

Note that although the number of vias 61 above gate electrode joiner 25 is one as shown in FIG. 1, a plurality of vias 61 may be formed if possible in terms of manufacturing techniques. Moreover, although the number of vias 61 above source electrode 11 and the number of vias 71 above drain electrodes 31 and 33 are suitably large for a reduction in the resistance of wirings, the number of vias are appropriately designed in terms of manufacturing techniques for forming vias and plugs.

As has been described above, the nitride semiconductor device according to Embodiment 1 includes: a base; a semiconductor stacked structure including a plurality of nitride semiconductor layers above the base; a first active area surrounded by an isolation area on a top surface side of the semiconductor stacked structure; and the following electrodes above the first active area: (i) a source electrode; (ii) a first gate electrode and a second gate electrode, one on either side of and spaced from the source electrode in a first direction in plan view; and (iii) at least one drain electrode located in a direction opposite the source electrode relative to the first gate electrode or the second gate electrode. The source electrode, the first gate electrode, the second gate electrode, and the at least one drain electrode each include a finger-shaped portion extending in a second direction perpendicular to the first direction in the plan view. A first dielectric film is disposed above the source electrode. The first gate electrode and the second gate electrode are electrically connected by a gate electrode joiner disposed above the first dielectric film.

According to the above, the formation of a wiring (this wiring includes finger-shaped portions) of the gate electrodes not outside the first active area, but inside the first active area in plan view can shorten the length of the wiring, and thus the resistance of the gate wiring can be reduced. This, as a result, yields an advantageous effect of being suitable for fast switching operation. In addition, the formation of the wiring of the gate electrodes inside the active area in plan view yields an advantageous effect of reducing an area of a chip as a nitride semiconductor device.

For example, the first gate electrode, the second gate electrode, and the gate electrode joiner may include the same metal layer.

According to the above, the gate electrode joiner can reduce the resistance of the wiring of the gate electrodes. The above even yields an advantageous effect of not increasing the number of manufacturing processes for forming the first gate electrode, the second gate electrode, and the gate electrode joiner.

For example, the gate electrode joiner may have a width greater than a length of the first gate electrode and a length of the second gate electrode.

According to the above, a wiring using a via and a plug can be formed for the gate electrode joiner, and thus the chip area can be reduced.

Variation 1 of Embodiment 1

Figure 3:
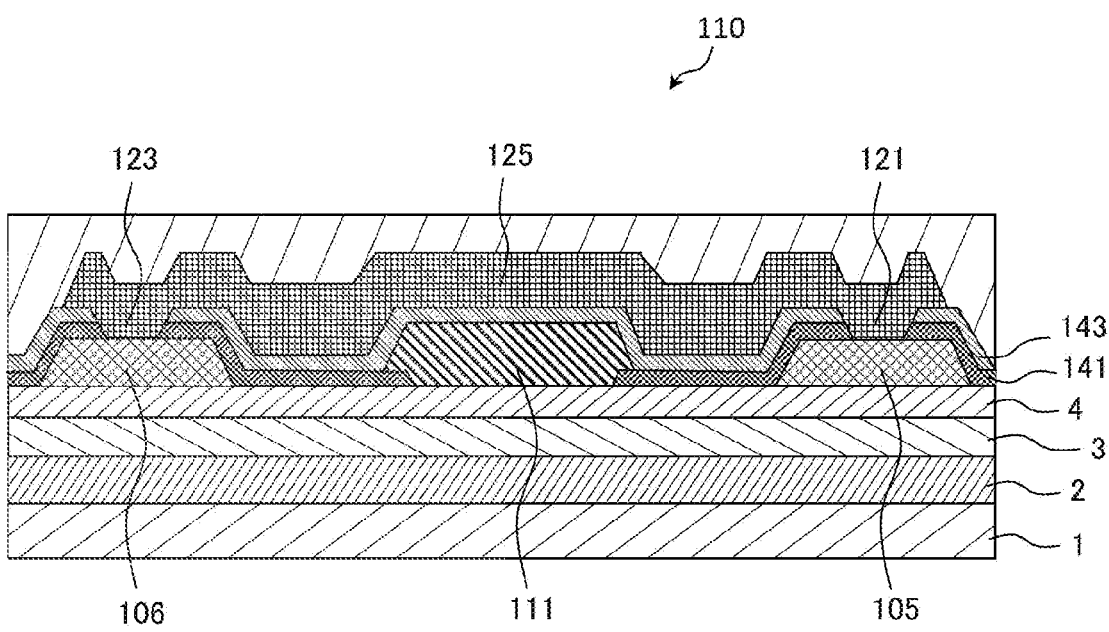
FIG. 3 is a cross-sectional view of a nitride semiconductor device according to Variation 1 of Embodiment 1.

FIG. 3 is a partial cross-sectional view of nitride semiconductor device 110 illustrating a variation of Embodiment 1. FIG. 3 specifically illustrates an enlarged portion of a portion corresponding to the vicinity of source electrode 11 according to Embodiment 1 which is illustrated in FIG. 2B. Illustrations of the drain electrodes, vias, plugs, wirings, etc. are omitted. As illustrated in FIG. 3, SiN film 141 is formed on the surfaces of AlGaN barrier layer 4 and p-type GaN layers 105 and 106 as a surface protection film. Source electrode 111 is formed by making an opening in SiN film 141. Furthermore, as first dielectric film 143, a SiO film is formed above SiN film 141. First gate electrode 121 and second gate electrode 123 are formed above p-type GaN layer 105 and p-type GaN layer 106, respectively, by making openings in SiN film 141 and first dielectric film 143. First gate electrode 121 and second gate electrode 123 are combined by gate electrode joiner 125.

In this variation, cross-sectional shapes of side faces of source electrode 111 which are in contact with first dielectric film 143 are forward tapered. The angle of the forward tapered portions suitably ranges from 45° to 75°, and more suitably ranges from 50° to 70°. With this shape, coverage of the side faces of source electrode 111 by first dielectric film 143 improves, and thus a void (gap) and a seam (joint) are less likely to be created. This, as a result, yields an advantageous effect of reducing the likelihood of an occurrence of a dielectric breakdown in first dielectric film 143, even if a reverse bias voltage of several tens of V is applied between source electrode 111 and gate electrode joiner 125.

In order to implement forward tapered cross-sectional shapes according to the variation, a resist used as an etching mask in dry etching is to be thermally treated such that the cross-sectional shapes are forward tapered, for example.

As has been described above, in the nitride semiconductor device according to Variation 1 of Embodiment 1, a portion of a side surface of the source electrode which is in contact with the first dielectric film is forward tapered.

According to the above, coverage of side faces of the source electrode by the first dielectric film improves, and thus the creation of a void (gap) and a seam (joint) is reduced. This, as a result, yields an advantageous effect of reducing the likelihood of an occurrence of a dielectric breakdown in the first dielectric film, even if a reverse bias voltage (e.g., several tens of V) is applied between the source electrode and the gate electrode joiner.

Variation 2 of Embodiment 1

Figure 4:
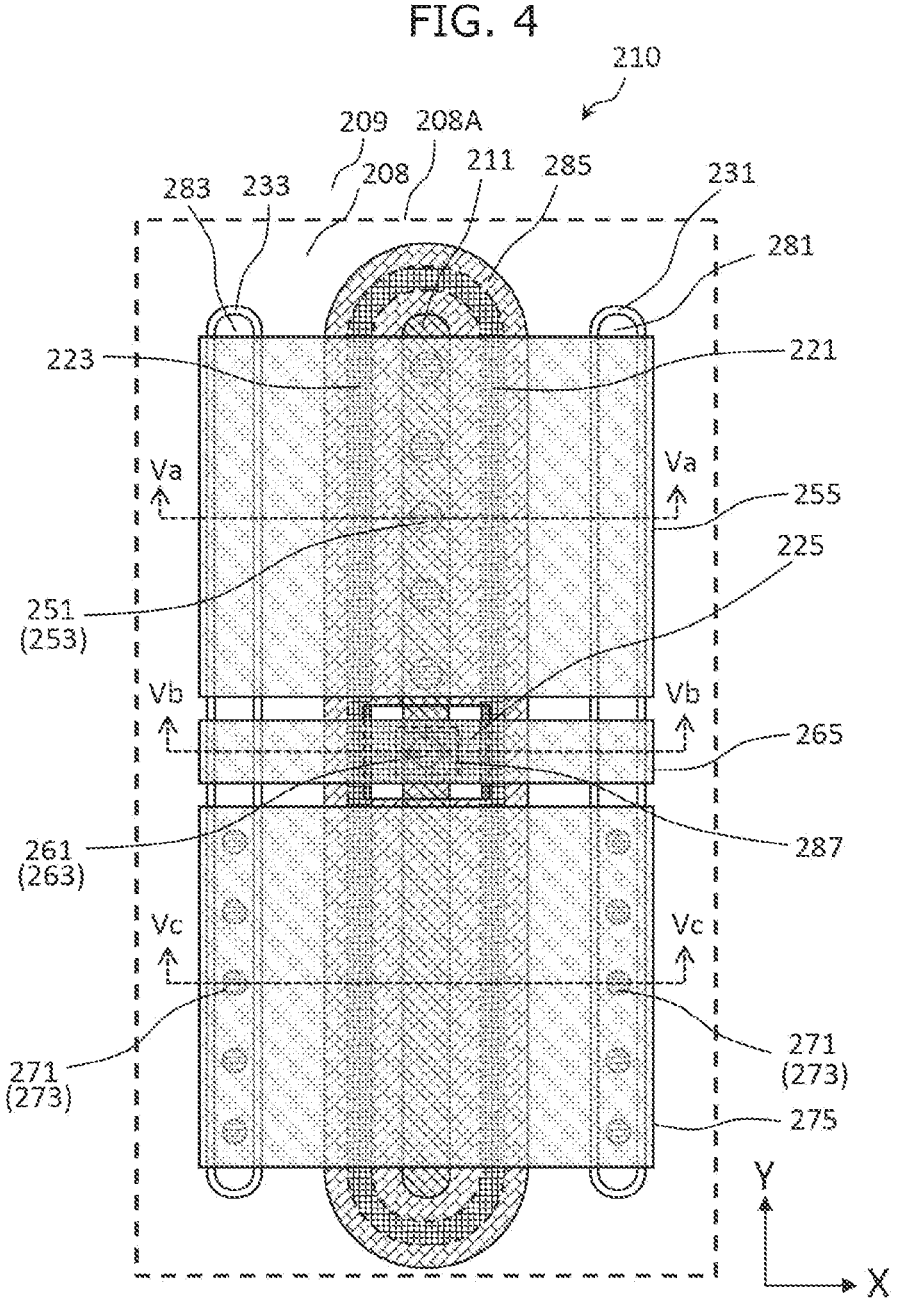
FIG. 4 is a plan view of a nitride semiconductor device according to Variation 2 of Embodiment 1.
Figure 5A:
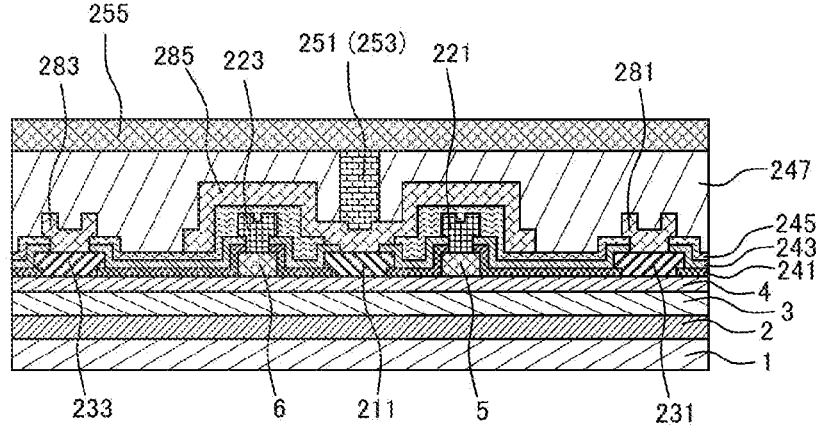
FIG. 5A is a cross-sectional view of the nitride semiconductor device according to Variation 2 of Embodiment 1 which is taken along line Va-Va shown in FIG. 4.
Figure 5B:
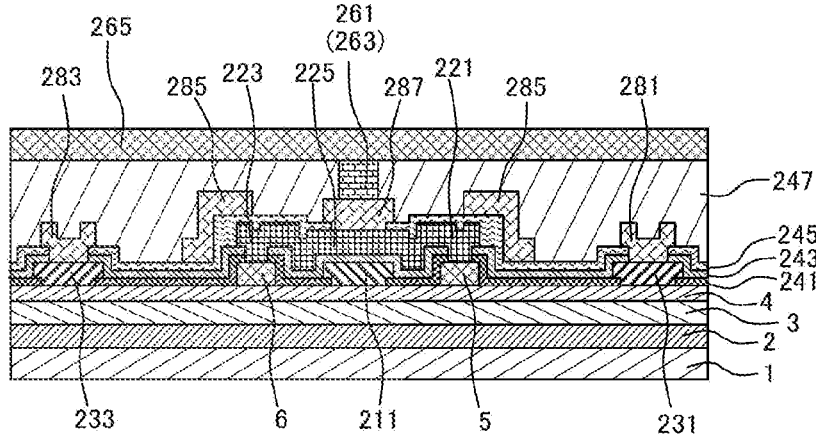
FIG. 5B is a cross-sectional view of the nitride semiconductor device according to Variation 2 of Embodiment 1 which is taken along line Vb-Vb shown in FIG. 4.
Figure 5C:
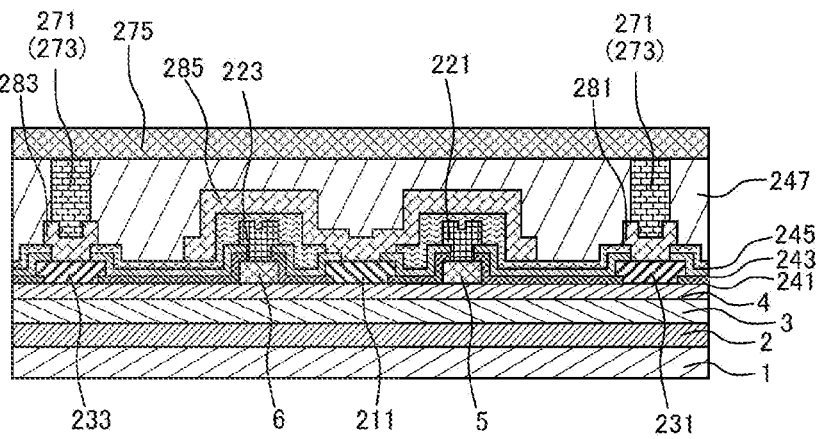
FIG. 5C is a cross-sectional view of the nitride semiconductor device according to Variation 2 of Embodiment 1 which is taken along line Vc-Vc shown in FIG. 4.

FIG. 4 illustrates a plan view of nitride semiconductor device 210 according to Variation 2 of Embodiment 1. FIG. 5A, FIG. 5B, and FIG. 5C illustrate cross-sectional views of nitride semiconductor device 210 taken along line Va-Va, line Vb-Vb, and line Vc-Vc shown in FIG. 4, respectively.

As illustrated in FIG. 5A, FIG. 5B, and FIG. 5C, buffer layer 2 including an AlN layer and an AlGaN layer, GaN channel layer 3, and AlGaN barrier layer 4 are formed above Si base 1 as a semiconductor stacked structure through epitaxial growth. P-type GaN layer 5 and p-type GaN layer 6 that have been epitaxially grown and etched thereafter are formed above AlGaN barrier layer 4. Highly-concentrated two-dimensional electron gas (not illustrated) is produced at the interface between GaN channel layer 3 and AlGaN barrier layer 4, resulting from the effects of piezoelectric polarization and spontaneous polarization. An area in which the above-described two-dimensional electron gas is produced is first active area 208 illustrated in FIG. 4, and an area made highly resistant to the two-dimensional electron gas by means of ion implantation is isolation area 209. The boundary between first active area 208 and isolation area 209 is ion implanted area boundary 208A. Note that isolation area 209 may be formed by removing an area containing two-dimensional electron gas through a mesa etching process.

As illustrated in FIG. 5A, FIG. 5B, and FIG. 5C, SiN film 241 is formed on the surfaces of AlGaN barrier layer 4, p-type GaN layer 5, and p-type GaN layer 6 as a surface protection film. Source electrode 211 and drain electrodes 231 and 233 are formed by making openings in SiN film 241. Furthermore, as first dielectric film 243, a SiO film is further formed above SiN film 241. First gate electrode 221 and second gate electrode 223 are formed above p-type GaN layer 5 and p-type GaN layer 6, respectively, by making openings in SiN film 241 and first dielectric film 243.

As illustrated in FIG. 4, first gate electrode 221 and second gate electrode 223 are formed on respective sides of and spaced from the finger-shaped source electrode 211 in the X direction. Furthermore, the finger-shaped drain electrode 231 is located in the direction opposite source electrode 211 relative to first gate electrode 221, and the finger-shaped drain electrode 233 is located in the direction opposite source electrode 211 relative to second gate electrode 223.

Moreover, first gate electrode 221 and second gate electrode 223 extend in the shape of a finger in the Y direction perpendicular to the X direction together with p-type GaN layer 5 and p-type GaN layer 6 formed below first gate electrode 221 and second gate electrode 223, respectively, and are connected at the two end portions each in the shape of an arc. The above-described configuration reduces leak currents that flow between source electrode 211 and drain electrode 231 and between source electrode 211 and drain electrode 233 during an OFF state. Note that when first gate electrode 221 and second gate electrode 223 are not connected at the end portions, these finger-shaped gate electrodes need to reach isolation area 209 across ion implanted area boundary 208A.

As illustrated in FIG. 5B, first gate electrode 221 and second gate electrode 223 are combined by gate electrode joiner 225 at the center portion between first gate electrode 221 and second gate electrode 223. This gate electrode joiner 225 includes the same metal layer as first gate electrode 221 and second gate electrode 223, and is simultaneously formed with first gate electrode 221 and second gate electrode 223. For this reason, there is no increase in the number of manufacturing processes. However, whereas first gate electrode 221 and second gate electrode 223 are in contact with p-type GaN layer 5 and p-type GaN layer 6, respectively, gate electrode joiner 225 is formed above the SiO film that is first dielectric film 243, and thus is electrically insulated from source electrode 211. Moreover, the width (the depth direction in plan view) of gate electrode joiner 225 is about 3 μm, and is designed greater than first gate electrode 221 and second gate electrode 223 both of which have lengths of about 1 μm. With this design, it is possible to perform a wiring process using vias and plugs which is difficult to perform above gate electrodes. The above-mentioned wiring process will be hereinafter described.

As illustrated in FIG. 5A, FIG. 5B, and FIG. 5C, SiO film 245 is formed as a field plate film that covers first gate electrode 221, second gate electrode 223, source electrode 211, and drain electrodes 231 and 233. As illustrated in FIG. 5A and FIG. 5C, low-resistance metal layer 285 that serves as a source field plate electrode is formed above source electrode 211 by making an opening in SiO film 245 and first dielectric film 243. Low-resistance metal layer 285 yields an advantageous effect of reducing electric field concentration in drain-side end portions of p-type GaN layer 5 and p-type GaN layer 6. In addition to an increase in withstand pressure, the foregoing results in a reduction in the occurrence of current collapse that is a problem to be addressed in nitride semiconductor devices. Furthermore, since this low-resistance metal layer 285 is formed above source electrode 211 other than the vicinity of gate electrode joiner 225, low-resistance metal layer 285 also yields an advantageous effect of reducing the resistance of a wiring of source electrode 211.

As illustrated in FIG. 5A, FIG. 5B, and FIG. 5C, low-resistance metal layer 281 and low-resistance metal layer 283 are formed above drain electrode 231 and drain electrode 233, respectively, by making openings in SiO film 245 and first dielectric film 243. As illustrated in FIG. 4, since these low-resistance metal layer 281 and low-resistance metal layer 283 are formed entirely above drain electrode 231 and drain electrode 233, respectively, low-resistance metal layer 281 and low-resistance metal layer 283 yield an advantageous effect of reducing the resistance of a wiring of drain electrode 231 and drain electrode 233.

Moreover, as illustrated in FIG. 5B, the formation of low-resistance metal layer 287 above gate electrode joiner 225 by making an opening in SiO film 245 also yields an advantageous effect of reducing the resistance of a gate wiring.

A SiO film that is second dielectric film 247 is formed above low-resistance metal layers 281, 283, 285, and 287. In a high voltage transistor, second dielectric film 247 is to be designed to have a thickness that can prevent an occurrence of a dielectric breakdown between the source and a drain. For example, when second dielectric film 247 is used as a SiO film in a transistor withstanding 600 V, the thickness of the film is to range from 2 μm to 3 μm. In this case, vias 251 above low-resistance metal layer 285, via 261 above low-resistance metal layer 287, and vias 271 above low-resistance metal layers 281 and 283 are formed by using a usual photolithography technique and a technique for dry etching second dielectric film 247, if even the smallest dimension in low-resistance metal layers 281, 283, 285, and 287 is about 3 μm or greater. Plugs 253, 263, and 273 that fill the above-described vias are then formed. Plugs 253, 263, and 273 each have a portion in contact with second dielectric film 247 where a TiN film is formed as a barrier layer, and tungsten (W) is used for these plugs. Plugs 253 are connected with first source lead wiring 255, plug 263 is connected to first gate lead wiring 265, and plugs 273 are connected to first drain lead wiring 275.

In this embodiment, first gate electrode 221 and second gate electrode 223 are connected by gate electrode joiner 225 at the center portion between first gate electrode 221 and second gate electrode 223. A gate wiring is formed by forming via 261 in gate electrode joiner 225. Accordingly, the resistance of the gate wiring is significantly reduced as compared to the case where a gate wiring is formed from end portions of gate electrodes. In addition, the gate wiring is formed, not above isolation area 209, but above first active area 208. This also results in no increase in the chip area. Furthermore, capacitance due to first dielectric film 243 is generated between source electrode 211 and gate electrode joiner 225. This capacitance is capacitance between the gates and the source. In order to prevent a power transistor for switching from being erroneously turned ON, it is desirable to increase the capacitance between the gates and the source relative to the capacitance between the gates and the drains. Accordingly, the use of this embodiment can implement a power transistor for switching that has a large capacitance between the gates and the source, and thus is capable of preventing the power transistor from being erroneously turned ON.

Note that although W is used as the plugs that fill the vias in nitride semiconductor device 210 according to the embodiment, aluminum (Al) and copper (Cu) may be used. When Cu is used, a dual-damascene method may be employed to simultaneously form a plug and a wiring connected thereto.

Note that although the number of vias 261 above low-resistance metal layer 287 that is above gate electrode joiner 225 is one as shown in FIG. 4, a plurality of vias 261 may be provided if possible in terms of manufacturing techniques. Moreover, although the number of vias 261 above source electrode 211 and the number of vias 271 above drain electrodes 231 and 233 are suitably large for a reduction in the resistance of wirings, the number of vias are appropriately designed in terms of manufacturing techniques for forming vias and plugs.

As has been described above, in the nitride semiconductor device according to Variation 2 of Embodiment 1, a low-resistance metal layer is disposed above each of the source electrode except for a portion below the gate electrode joiner and the at least one drain electrode.

According to the above, since a low-resistance metal layer is formed above the source electrode, the low-resistance metal layer yields an advantageous effect of reducing the resistance of a wiring of the source electrode. In addition, since the low-resistance metal layer is formed above the drain electrodes, the low-resistance metal layer yields an advantageous effect of reducing the resistance of a wiring of the drain electrodes.

For example, the low-resistance metal layer disposed above the source electrode may be a source field plate electrode that extends in a direction toward the at least one drain electrode over the first gate electrode and the second gate electrode.

According to the above, the low-resistance metal layer yields an advantageous effect of reducing electric field concentration in a drain-side end portion. This, as a result, yields an advantageous effect of reducing an occurrence of current collapse, in addition to an increase in withstand pressure.

Embodiment 2

Figure 6:
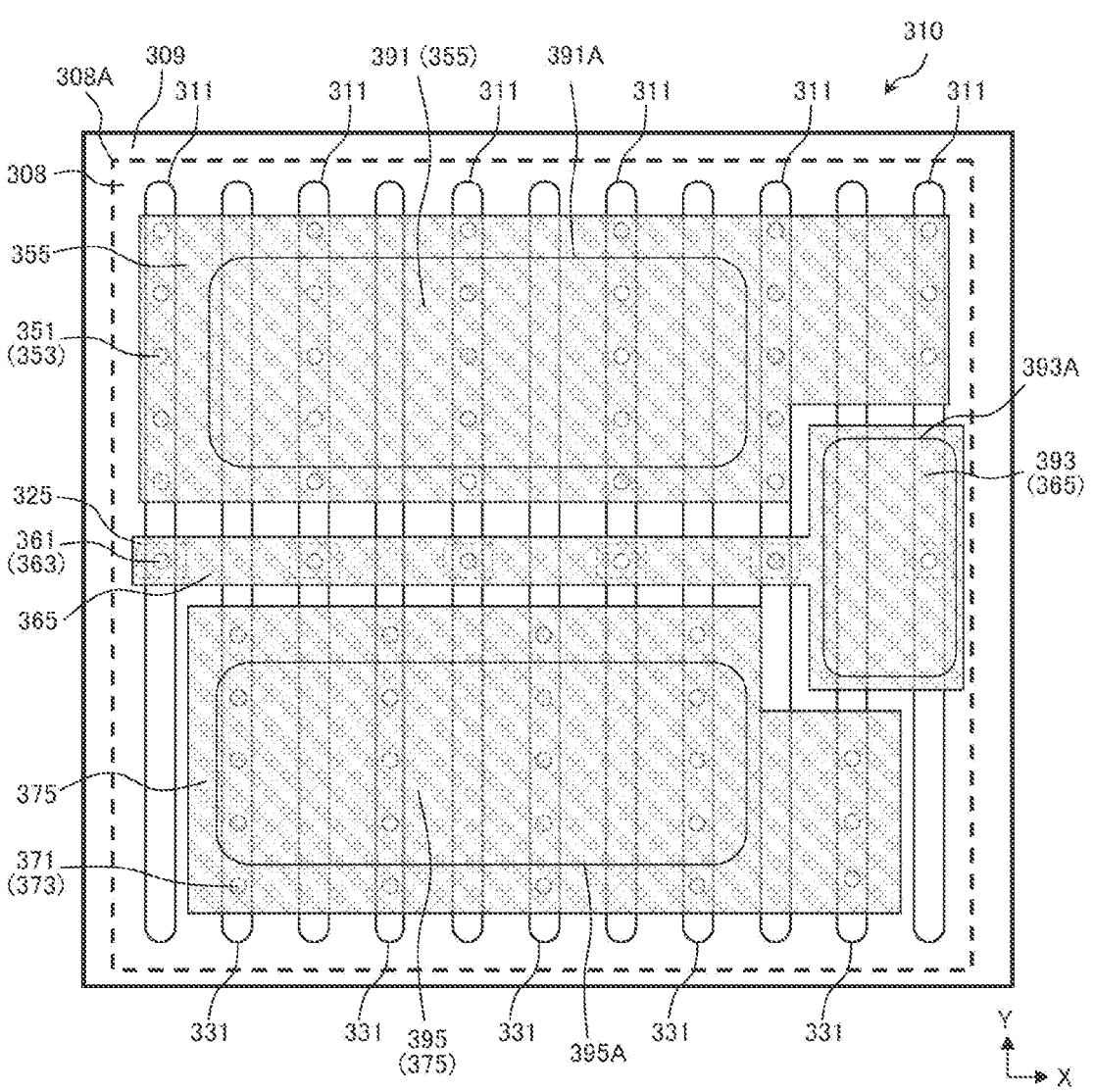
FIG. 6 is a plan view of a nitride semiconductor device according to Embodiment 2.

FIG. 6 illustrates a plan view of nitride semiconductor device 310 according to Embodiment 2.

This embodiment presents a power transistor that is configured by repeatedly disposing the nitride semiconductor device according to Embodiment 1 or Variations 1 or 2 thereof in the X direction shown in FIG. 6. In FIG. 6, illustrations of structural elements not particularly necessary for describing the embodiment are omitted for simplification of the description.

As illustrated in FIG. 6, a plurality of source electrodes 311 and a plurality of drain electrodes 331 each of which extends in the Y direction in the shape of a finger are alternately disposed in the X direction. The disposition of source electrodes 311 that tend to be grounded at both ends in the X direction instead of disposing drain electrodes 331 to which a high voltage is applied at both ends in the X direction yields an advantageous effect of preventing entrance of water from outside, and is excellent in terms of reliability. Vias 361 are provided in openings made in a dielectric film (not illustrated) formed above gate electrode joiners 325 that are formed above the plurality of source electrodes 311, and plugs 363 are provided so as to fill vias 361. First gate lead wiring 365 is formed so as to connect all plugs 363. First gate lead wiring 365 has an end portion in which gate pad 393 having a large area lies. Gate pad 393 includes gate pad opening 393A in a surface protection film (not illustrated) of nitride semiconductor device 310.

Vias 351 are provided in openings made in the dielectric film (not illustrated) formed above the plurality of source electrodes 311, and plugs 353 are provided so as to fill vias 351. First source lead wiring 355 is formed so as to connect all plugs 353. First source lead wiring 355 has the center portion in which source pad 391 lies. Source pad 391 includes source pad opening 391A in the surface protection film (not illustrated).

Vias 371 are provided in openings made in the dielectric film (not illustrated) formed above the plurality of drain electrodes 331, and plugs 373 are provided so as to fill vias 371. First drain lead wiring 375 is formed so as to connect all plugs 373. First drain lead wiring 375 has the center portion in which drain pad 395 lies. Drain pad 395 includes drain pad opening 395A in the surface protection film (not illustrated).

In this embodiment, first source lead wiring 355 and first drain lead wiring 375 are disposed with first gate lead wiring 365 therebetween. Since first gate lead wiring 365 is connected to each gate electrode (not illustrated) through each gate electrode joiner 325, the resistance of the gate wiring is low. Moreover, since first gate lead wiring 365 is disposed above first active area 308, there is no increase in the chip area.

In this embodiment, first gate lead wiring 365, first source lead wiring 355, and first drain lead wiring 375 include the same metal layer. This simplifies the manufacturing process. The same metal layer includes, for example, aluminum (Al), copper (Cu), and gold (Au). If a dual-damascene method is employed particularly in the case where Cu is used, plugs 363, 353, and 373 can be simultaneously formed, and thus the manufacturing process is further simplified.

The nitride semiconductor device according to this embodiment includes first active area 308, isolation area 309, and ion implanted area boundary 308A that is a boundary between the foregoing two areas. Since the proportion of first active area 308 to the chip area is high in nitride semiconductor device 310, on-resistance is low and the chip area is small.

As has been described above, in the nitride semiconductor device according to Embodiment 2, the source electrode, the first gate electrode, the second gate electrode, the gate electrode joiner, and the at least one drain electrode are repeatedly disposed in the first direction. A second dielectric film is disposed above a plurality of gate electrode joiners each of which is the gate electrode joiner. The nitride semiconductor device includes a first gate lead wiring that electrically connects the plurality of gate electrode joiners through vias in the second dielectric film, and extends in the first direction.

The above yields an advantageous effect of being able to control a large current for current supply in fast switching operation. The above also yields an advantageous effect of being able to reduce the chip area since the first source lead wiring and the first drain lead wiring are disposed with first gate lead wiring 365 therebetween.

For example, the second dielectric film may also be disposed above the source electrode, the first gate electrode, the second gate electrode, and the at least one drain electrode which are repeatedly disposed in the first direction. The nitride semiconductor device may include a first source lead wiring and a first drain lead wiring disposed with the first gate lead wiring therebetween. The first source lead wiring electrically connects a plurality of source electrodes each of which is the source electrode through vias in the second dielectric film and extends in the first direction. The first drain lead wiring electrically connects a plurality of drain electrodes each of which is the at least one drain electrode through vias in the second dielectric film and extends in the first direction.

The above yields an advantageous effect of reducing on-resistance and the chip area, since the proportion of the first active area to the chip area of the nitride semiconductor device can be increased.

For example, the first gate lead wiring, the first source lead wiring, and the first drain lead wiring may include the same metal wiring layer.

The above yields an advantageous effect of simplifying a manufacturing process in the formation of the first gate lead wiring, the first source lead wiring, and the first drain lead wiring.

For example, the nitride semiconductor device may include a gate pad disposed in a part of the first gate lead wiring, a source pad disposed in a part of the first source lead wiring, and a drain pad disposed in a part of the first drain lead wiring.

Since above implements a pad on element (POE) technique or a pad over active (POA) technique for providing a gate pad, a source pad, and a drain pad above the first active area, it is possible to yield an advantageous effect of preventing an increase in the chip area due to the pads or an advantageous effect of reducing the chip area.

Variation of Embodiment 2

Figure 7:
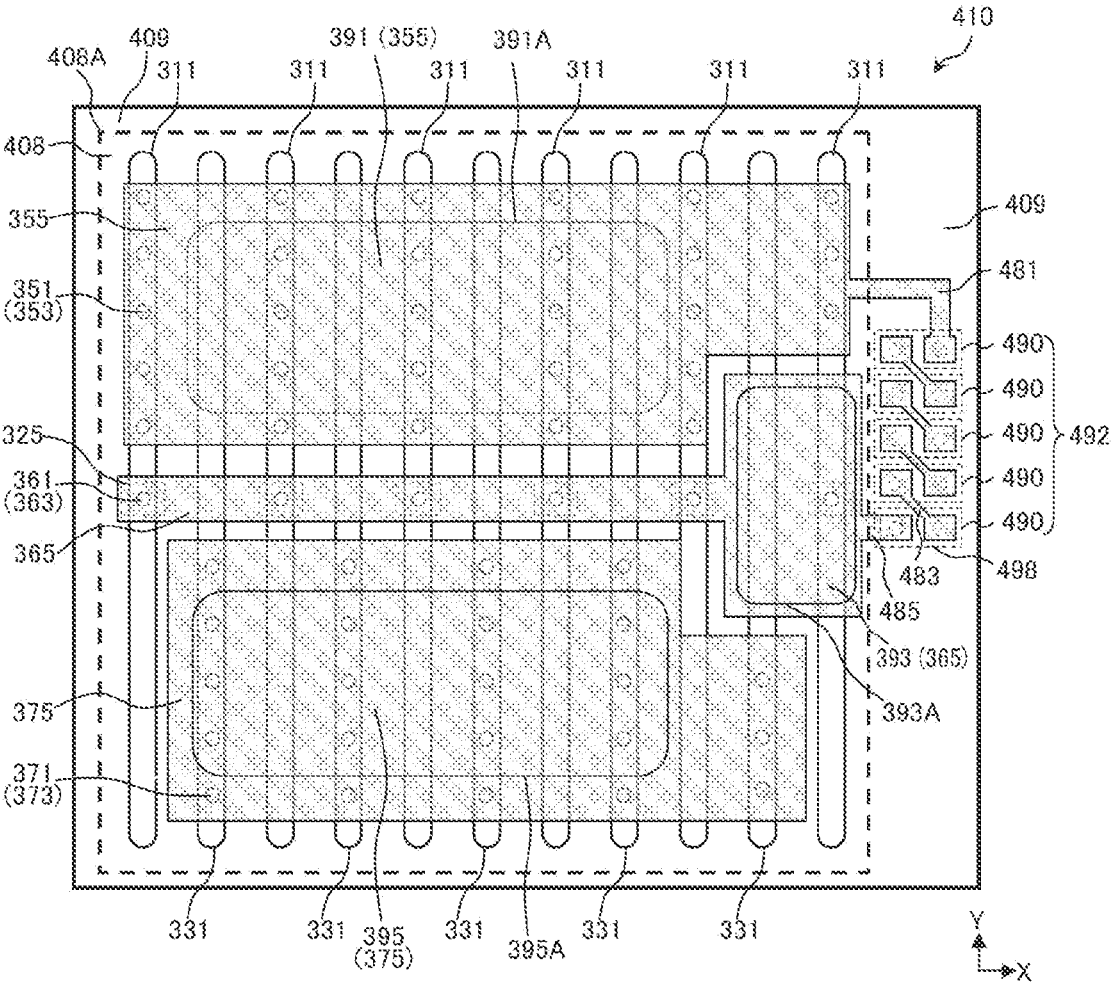
FIG. 7 is a plan view of a nitride semiconductor device according to a variation of Embodiment 2.
Figure 8:
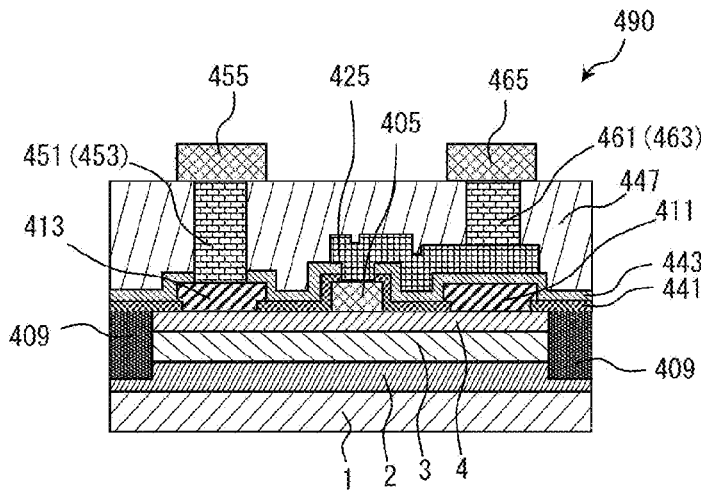
FIG. 8 is a cross-sectional view of a p-n diode used in the nitride semiconductor device according to the variation of Embodiment 2.

FIG. 7 illustrates a plan view of nitride semiconductor device 410 according to a variation of Embodiment 2, and FIG. 8 illustrates a cross-sectional view of p-n diode 490 that is a structural element of nitride semiconductor device 410. This variation presents a configuration in which protection diode 492 including serially connected p-n diodes 490 is inserted between the gate and the source of nitride semiconductor device 310 according to Embodiment 2. This protection diode 492 is formed through the same manufacturing process as an FET and is integrated above the same chip as the FET.

As illustrated in FIG. 8, buffer layer 2 including an AlN layer and an AlGaN layer, GaN channel layer 3, and AlGaN barrier layer 4 are formed above Si base 1 as a semiconductor stacked structure through epitaxial growth. P-type GaN layer 405 that has been epitaxially grown and etched thereafter is formed above AlGaN barrier layer 4. Highly-concentrated two-dimensional electron gas (not illustrated) is produced at the interface between GaN channel layer 3 and AlGaN barrier layer 4, resulting from the effects of piezoelectric polarization and spontaneous polarization. An area made highly resistant to the two-dimensional electron gas by means of ion implantation is isolation area 409.

SiN film 441 is formed on the surfaces of AlGaN barrier layer 4 and p-type GaN layer 405 as a surface protection film. Dummy electrode 411 and cathode electrode 413 are formed by making openings in SiN film 441. Furthermore, a SiO film as first dielectric film 443 is formed on SiN film 441. Anode electrode 425 is formed above p-type GaN layer 405 by making an opening in SiN film 441 and first dielectric film 443. Anode electrode 425 extends up to above dummy electrode 411.

A SiO film that is second dielectric film 447 is formed above anode electrode 425 and cathode electrode 413. Via 451 above cathode electrode 413 and via 461 above anode electrode 425 are formed using a usual photolithography technique and a technique for dry etching second dielectric film 447 and first dielectric film 443. Plugs 453 and 463 that fill the above-described vias are then formed. Plugs 453 and 463 each have a portion in contact with second dielectric film 447 where a TiN film is formed as a barrier layer, and tungsten (W) is used for these plugs. Plug 453 is connected with cathode electrode lead wiring 455, and plug 463 is connected to anode electrode lead wiring 465.

FIG. 7 illustrates nitride semiconductor device 410 including protection diode 492 that is electrically interposed between the source and the gate. Protection diode 492 includes five p-n diodes 490 shown in FIG. 8 which are connected in series. Each p-n diode 490 is formed inside second active area 498 that is surrounded by isolation area 409 having high resistance by means of ion implantation. In addition, five p-n diodes 490 are electrically connected in series through anode-to-cathode wiring 483. Protection diode 492 is connected to first source lead wiring 355 through anode-to-source wiring 481, and is connected to first gate lead wiring 365 or gate pad 393 through cathode-to-gate wiring 485.

A breakdown voltage of a SiO film is about 3 MV/cm. Accordingly, if a SiO film (not illustrated) between source electrodes 311 and gate electrode joiners 325 has a thickness of 0.1 μm in FIG. 7, a breakdown voltage would be 30 V. Meanwhile, a rising voltage of a p-n diode of GaN is about 3.5 V. Since nitride semiconductor device 410 according to the embodiment includes protection diode 492 in which five p-n diodes 490 are provided in series, a current flows when reverse bias of about 17.5 V is applied between the sources and the gates. In other words, a sufficient voltage margin protects the sources to the gates of nitride semiconductor device 410 without an occurrence of a dielectric breakdown in a dielectric film between gate electrode joiners 325 and source electrodes 311.

As illustrated in FIG. 7, since nitride semiconductor device 410 has a greater isolation area 409 due to protection diode 492 as compared to nitride semiconductor device 310, the chip area is somewhat increased. However, since protection diode 492 can be designed to have a smaller area as compared to an FET that is a power transistor, an increase in the chip area is small.

Note that although the number of p-n diodes that is connected in series in nitride semiconductor device 410 according to the embodiment is five, the number of p-n diodes may be appropriately designed, for example, from three to ten, according to a required protection voltage.

In nitride semiconductor device 410 according to the embodiment, a proportion of first active area 408 to the chip area is smaller than that of nitride semiconductor device 310 according to Embodiment 2, but is sufficiently large as compared to the case in which a POE technique is not used. This results in low on-resistance and a small chip area.

As has been described above, the nitride semiconductor device according to Variation 1 of Embodiment 2 includes a second active area surrounded by the isolation area above the base. A protection diode in which a plurality of diodes disposed in the second active area are connected in series is disposed. The protection diode includes an anode that is electrically connected to the source electrode. The protection diode includes a cathode that is electrically connected to the gate electrode joiner. A rising voltage of a current that flows from the anode of the protection diode to the cathode of the protection diode is lower than a breakdown voltage of the first dielectric film.

The above yields an advantageous effect of preventing an occurrence of a dielectric breakdown in a dielectric film between the gate electrode joiners and the source electrodes and improving reliability of the nitride semiconductor device.

Embodiment 3

Figure 9:
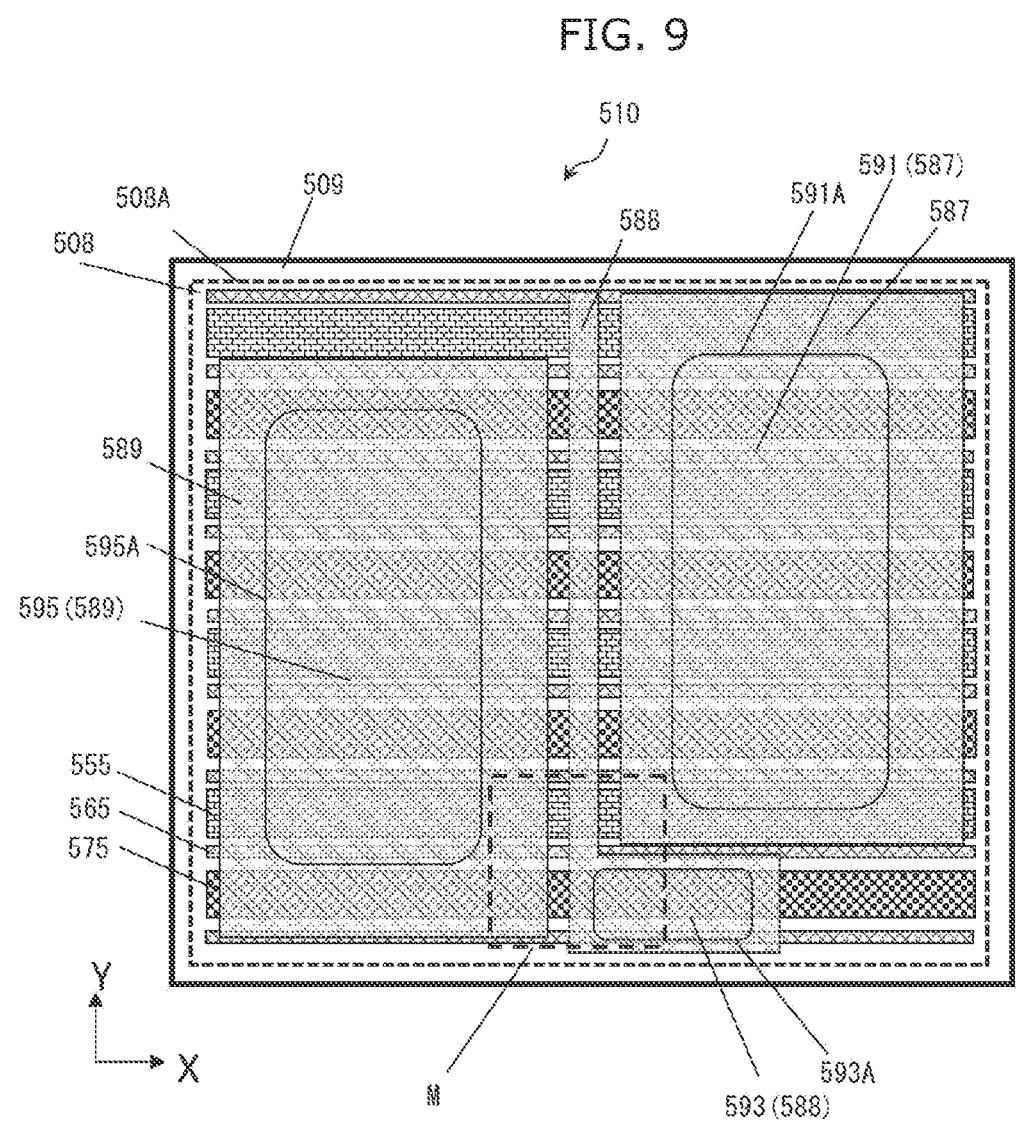
Figure 10:
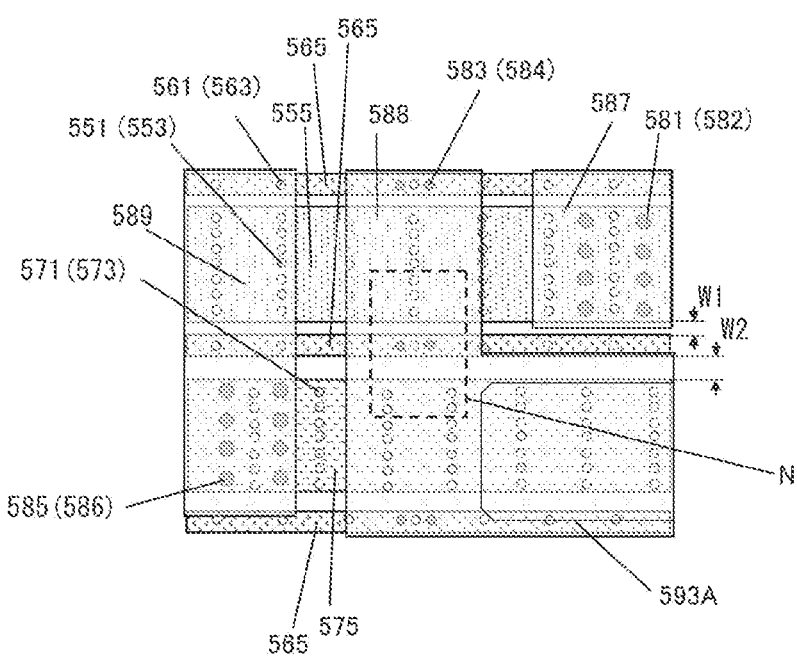
FIG. 10 is an enlarged plan view of dotted line portion M shown in FIG. 9.
Figure 11:
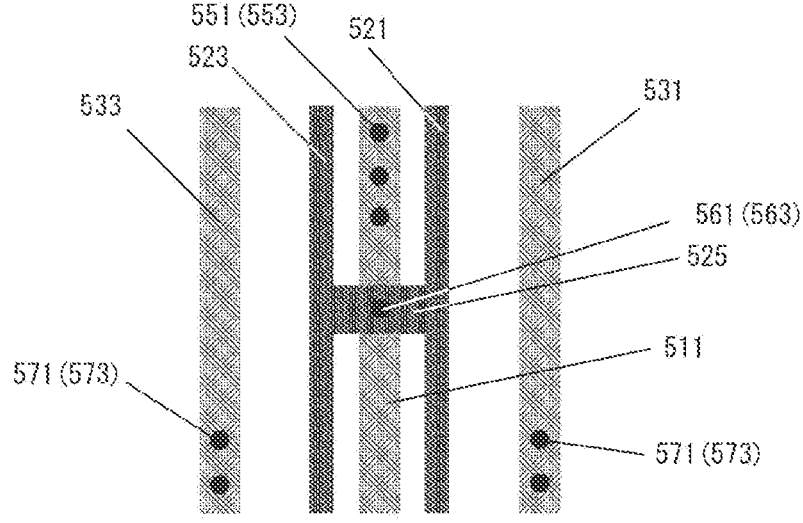
FIG. 11 is an enlarged plan view of dotted line portion N shown in FIG. 10.

FIG. 9, FIG. 10, and FIG. 11 illustrate plan views of nitride semiconductor device 510 according to Embodiment 3 of the present disclosure. FIG. 10 illustrates an enlarged view of dotted line portion M shown in FIG. 9, and FIG. 11 illustrates an enlarged view of dotted line portion N shown in FIG. 10. A wiring layer is omitted from FIG. 11 for description of an FET portion lain below the wiring layer.

FIG. 11 illustrates the same configuration as the configuration according to Embodiment 1. First gate electrode 521 and second gate electrode 523 are combined by gate electrode joiner 525 at the center portion between first gate electrode 521 and second gate electrode 523. This gate electrode joiner 525 includes the same metal layer as first gate electrode 521 and second gate electrode 523, and is simultaneously formed with first gate electrode 521 and second gate electrode 523. For this reason, there is no increase in the number of manufacturing processes. However, whereas first gate electrode 521 and second gate electrode 523 are in contact with the p-type GaN layers, gate electrode joiner 525 is formed above a SiO film (not illustrated) that is a first dielectric film, and thus is electrically insulated from source electrode 511. Moreover, the width of gate electrode joiner 525 is about 3 μm, and is designed greater than first gate electrode 521 and second gate electrode 523 both of which have lengths of about 1 μm. With this design, it is possible to perform a wiring process using vias and plugs which is difficult to perform above gate electrodes. The above-mentioned wiring process will be hereinafter described.

A SiO film (not illustrated) that is a second dielectric film is formed above first gate electrode 521, second gate electrode 523, gate electrode joiner 525, source electrode 511, drain electrodes 531 and 533. In a high voltage transistor, the SiO film is to be designed to have a thickness that can prevent an occurrence of a dielectric breakdown between the source and the drains. For example, the thickness of the SiO film is to range from 2 μm to 3 μm in a transistor withstanding 600 V. In this case, vias 551 above source electrode 511, via 561 above gate electrode joiner 525, and vias 571 above drain electrodes 531 and 533 are formed using a usual photolithography technique and a technique for dry etching the SiO film, if source electrode 511, gate electrode joiner 525, and drain electrodes 531 and 533 each have a width of about 3 μm. Plugs 553, 563, and 573 that fill the above-described vias are then formed. Plugs 553, 563, and 573 each have a portion in contact with the SiO film where a TiN film is formed as a barrier layer, and tungsten (W) is used for these plugs.

As illustrated in FIG. 10, plugs 553 are connected with first source lead wiring 555, plugs 563 are connected to first gate lead wirings 565, and plugs 573 are connected to first drain lead wiring 575. A SiO film (not illustrated) as a third dielectric film is formed above first source lead wiring 555, first gate lead wirings 565, and first drain lead wiring 575. In the same manner as has been described above, vias 581 above the first source lead wiring, vias 583 above the first gate lead wirings, and vias 585 above the first drain lead wiring are formed using a photolithography technique and a technique for dry etching the third SiO film. Plugs 582, 584, and 586 that fill the above-described vias are then formed. Plugs 582, 584, and 586 each have a portion in contact with the SiO film where a TiN film is formed as a barrier layer, and tungsten (W) is used for these plugs. Plugs 582 are connected with second source lead wiring 587, plugs 584 are connected to second gate lead wiring 588, and plugs 586 are connected to second drain lead wiring 589.

In FIG. 10, first source lead wiring 555 is interposed between first gate lead wirings 565, and first drain lead wiring 575 is interposed between first gate lead wirings 565. As a result, in addition to a reduction in the resistance of the gate wirings, the reliability pertaining to moisture resistance improves since first drain lead wiring 575 to which a high voltage is applied is not disposed at a chip end.

Furthermore, in FIG. 10, distance W2 between first drain lead wiring 575 and first gate lead wiring 565 is greater than distance W1 between first source lead wiring 555 and first gate lead wiring 565. This results in improvement in reliability pertaining to moisture resistance since an electric field in the vicinity of first drain lead wiring 575 to which a high voltage is applied is reduced.

As illustrated in FIG. 9, second gate lead wiring 588 extends in the Y direction and has an end portion in which gate pad 593 having a large area lies. Gate pad 593 includes gate pad opening 593A in a surface protection film (not illustrated) of nitride semiconductor device 510. Moreover, second source lead wiring 587 extends in the Y direction, and source pad 591 lies near the center portion of second source lead wiring 587. Source pad 591 includes source pad opening 591A in the surface protection film (not illustrated) of nitride semiconductor device 510. Similarly, second drain lead wiring 589 extends in the Y direction, and drain pad 595 lies near the center portion of second drain lead wiring 589. Drain pad 595 includes drain pad opening 595A in the surface protection film (not illustrated) of nitride semiconductor device 510.

The nitride semiconductor device according to this embodiment includes first active area 508, isolation area 509, and ion implanted area boundary 508A that is a boundary between the foregoing two areas. Since the proportion of first active area 508 to the chip area is high in nitride semiconductor device 510, on-resistance is low and the chip area is small.

In this embodiment, second gate lead wiring 588, second source lead wiring 587, and second drain lead wiring 589 include the same metal layer. This simplifies the manufacturing process. The same metal layer includes, for example, aluminum (Al), copper (Cu), and gold (Au). If a dual-damascene method is employed particularly in the case where Cu is used, plugs 582, 584, and 586 can be simultaneously formed, and thus the manufacturing process is further simplified.

Although Embodiment 2 and the variation of Embodiment 2 exemplified the case where all pads are formed using a single wiring layer, two wiring layers are used in this embodiment. As a result, the resistance of each wiring of the sources, the drains, and the gates can be reduced even if the lengths of fingers of sources and drains increase or even if the number of fingers of the sources and the drains increases as compared to the case where only a single wiring layer is used. Particularly, the use of two wiring layers can significantly reduce the resistance of the gate wirings as compared to embodiments according to PTL 2, etc. Furthermore, since the gate wirings need not be formed in isolation area 509, the chip area is also reduced.

Note that, as in the variation of Embodiment 2, a protection diode may be interposed between the source and the gate in this embodiment.

As has been described above, in the nitride semiconductor device according to Embodiment 3, the first gate lead wiring, the first source lead wiring, and the first drain lead wiring comprise a plurality of first gate lead wirings, a plurality of first source lead wirings, and a plurality of first drain lead wirings, respectively. A third dielectric film is disposed above the plurality of first gate lead wirings, the plurality of first source lead wirings, and the plurality of first drain lead wirings. The nitride semiconductor device includes: a second gate lead wiring that electrically connects the plurality of first gate lead wirings through vias in the third dielectric film, and extends in the second direction; a second source lead wiring that electrically connects the plurality of first source lead wirings through vias in the third dielectric film, and extends in the second direction; and a second drain lead wiring that electrically connects the plurality of first drain wirings through vias in the third dielectric film, and extends in the second direction.

According to the above, since two wiring layers connected through vias are used, the resistance of each lead wiring of the sources, the drains, and the gates can be reduced as compared to the case where only a single wiring layer is used. Particularly, the use of two wiring layers composed of the first gate lead wirings and the second gate lead wiring yields an advantageous effect of reducing the resistance of the gate wirings. Furthermore, no need to form the gate lead wirings in the isolation area yields an advantageous effect of enabling a reduction in the chip area.

For example, each of the plurality of first source lead wirings may be interposed between first gate lead wirings included in the plurality of first gate lead wirings, and each of the plurality of first drain lead wirings may be interposed between first gate lead wirings included in the plurality of first gate wirings.

In addition to a reduction in the resistance of the gate wirings, the above results in improvement in the reliability pertaining to moisture resistance since a first drain lead wiring to which a high voltage is applied is not disposed at a chip end.

For example, a distance between each of the plurality of first drain lead wirings and a corresponding one of the plurality of first gate lead wirings may be greater than a distance between a corresponding one of the plurality of first source lead wirings and the corresponding one of the plurality of first gate lead wirings.

According to the above, electric fields in the vicinity of the first drain lead wirings to each of which a high voltage is applied are reduced, and thus reliability pertaining to moisture resistance can be improved.

For example, the second gate lead wiring, the second source lead wiring, and the second drain lead wiring may include the same metal wiring layer.

According to the above, a manufacturing process of forming the second gate lead wiring, the second source lead wiring, and the second drain lead wiring can be simplified.

For example, the nitride semiconductor device may include: a gate pad disposed in a part of the second gate lead wiring; a source pad disposed in a part of the second source lead wiring; and a drain pad disposed in a part of the second drain lead wiring.

According to the above, it is possible to yield an advantageous effect of greatly reducing the chip area since a POE technique is implemented for two layers.

Embodiment 4

Figure 12:
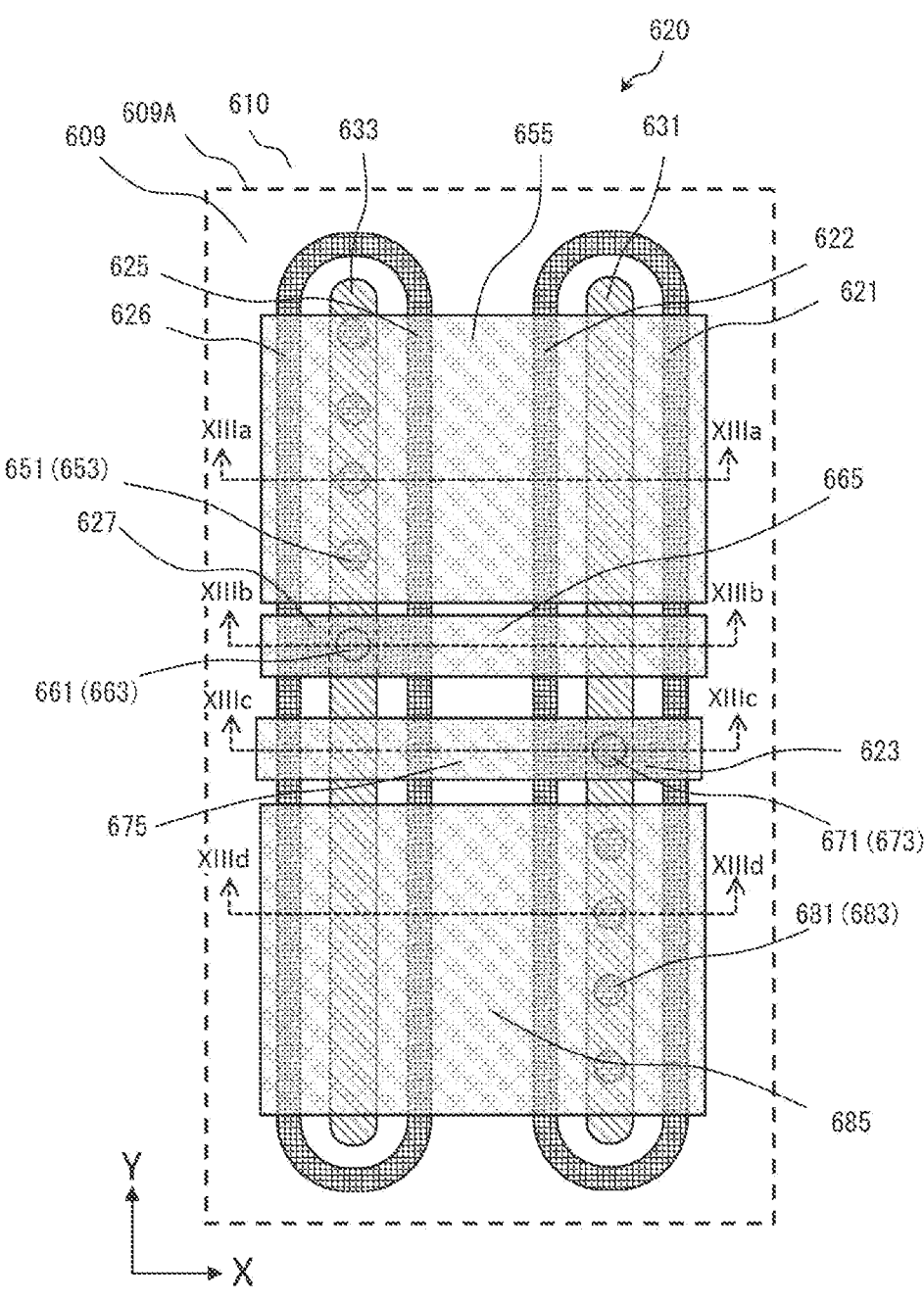
FIG. 12 is a plan view of a nitride semiconductor device according to Embodiment 4.

FIG. 12 illustrates a plan view of nitride semiconductor device 620 according to Embodiment 4. FIG. 13A, FIG. 13B, FIG. 13C, and FIG. 13D illustrate cross-sectional views of nitride semiconductor device 620 taken along line XIIIa-XIIIa, line XIIIb-XIIIb, line XIIIc-XIIIc, and line XIIId-XIIId shown in FIG. 12, respectively. This embodiment exemplifies a double gate transistor including two gates.

As illustrated in FIG. 13A, FIG. 13B, FIG. 13C, and FIG. 13D, buffer layer 2 including an AlN layer and an AlGaN layer, GaN channel layer 3, and AlGaN barrier layer 4 are formed above Si base 1 as a semiconductor stacked structure through epitaxial growth. P-type GaN layers 605,606, 607, and 608 that have been epitaxially grown and etched thereafter are formed above AlGaN barrier layer 4. Highly-concentrated two-dimensional electron gas (not illustrated) is produced at the interface between GaN channel layer 3 and AlGaN barrier layer 4, resulting from the effects of piezoelectric polarization and spontaneous polarization. An area in which the above-described two-dimensional electron gas is produced is active area 609 illustrated in FIG. 12, and an area made highly resistant to the two-dimensional electron gas by means of ion implantation is isolation area 610. The boundary between the above-described areas is ion implanted area boundary 609A. Note that isolation area 610 may be formed by removing an area containing two-dimensional electron gas through a mesa etching process.

As illustrated in FIG. 13A, FIG. 13B, FIG. 13C, and FIG. 13D, SiN film 641 is formed on the surfaces of AlGaN barrier layer 4 and p-type GaN layers 605,606, 607, and 608 as a surface protection film. First source electrode 631 and second source electrode 633 are formed by making openings in SiN film 641. Furthermore, a SiO film as first dielectric film 643 is formed above SiN film 641. First gate electrode 621, second gate electrode 622, third gate electrode 625, and fourth gate electrode 626 are formed above p-type GaN layer 605, p-type GaN layer 606, p-type GaN layer 607, and p-type GaN layer 608, respectively, by making openings in SiN film 641 and first dielectric film 643.

As illustrated in FIG. 12, first gate electrode 621 and second gate electrode 622 are formed on respective sides of and spaced from the finger-shaped first source electrode 631 in the X direction. In addition, third gate electrode 625 and fourth gate electrode 626 are formed on respective sides of and spaced from the finger-shaped second source electrode 633 in the X direction.

Moreover, first gate electrode 621 and second gate electrode 622 extend in the shape of a finger in the Y direction perpendicular to the X direction together with p-type GaN layer 605 and p-type GaN layer 606 formed below first gate electrode 621 and second gate electrode 622, respectively, and are connected at the two end portions each in the shape of an arc. The above-described configuration reduces a leak current that flows between first source electrode 631 and second source electrode 633 during an OFF state. When first gate electrode 621 and second gate electrode 622 are not connected at the end portions, these finger-shaped gate electrodes need to reach isolation area 610 across ion implanted area boundary 609A. The same applies to third gate electrode 625 and fourth gate electrode 626.

Figure 13A:
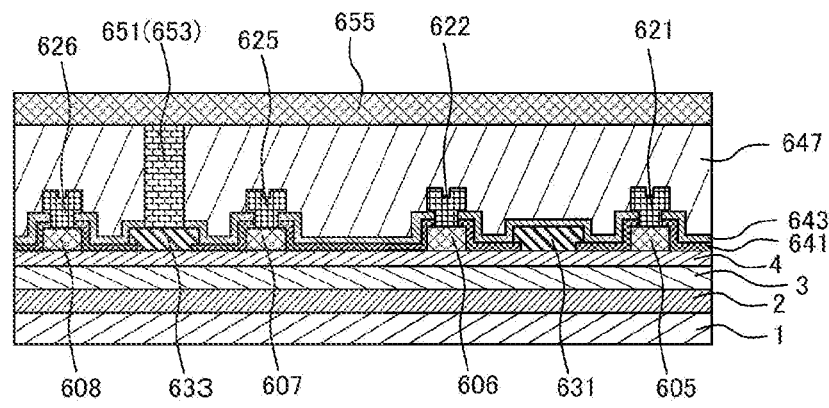
FIG. 13A is a cross-sectional view of the nitride semiconductor device according to Embodiment 4 which is taken along line XIIIa-XIIIa shown in FIG. 12.
Figure 13B:
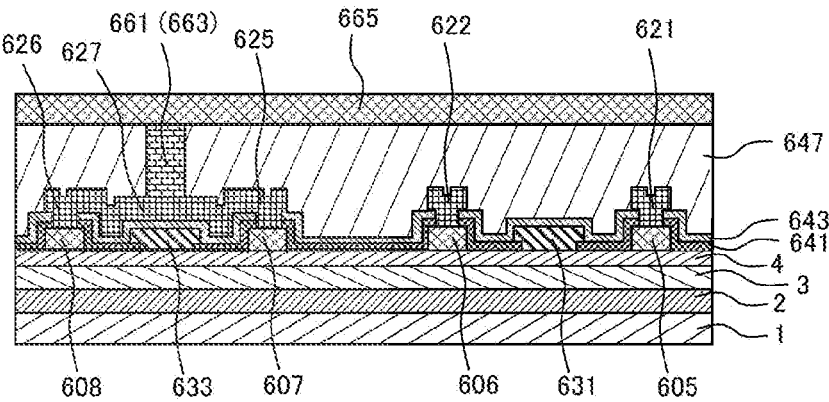
FIG. 13B is a cross-sectional view of the nitride semiconductor device according to Embodiment 4 which is taken along line XIIIb-XIIIb shown in FIG. 12.
Figure 13C:
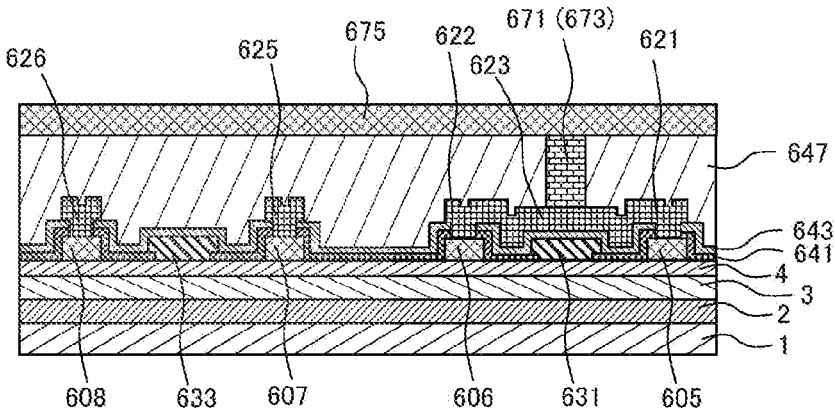
FIG. 13C is a cross-sectional view of the nitride semiconductor device according to Embodiment 4 which is taken along line XIIIc-XIIIc shown in FIG. 12.
Figure 13D:
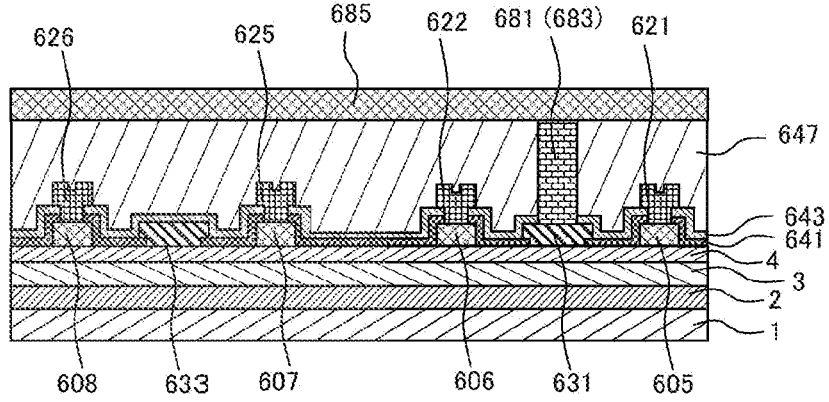
FIG. 13D is a cross-sectional view of the nitride semiconductor device according to Embodiment 4 which is taken along line XIIId-XIIId shown in FIG. 12.

As illustrated in FIG. 13C, first gate electrode 621 and second gate electrode 622 are combined by first gate electrode joiner 623 near the center portion between first gate electrode 621 and second gate electrode 622. This first gate electrode joiner 623 includes the same metal layer as first gate electrode 621 and second gate electrode 622, and is simultaneously formed with first gate electrode 621 and second gate electrode 622. For this reason, there is no increase in the number of manufacturing processes. However, whereas first gate electrode 621 and second gate electrode 622 are in contact with the p-type GaN layer 605 and p-type GaN layer 606, respectively, gate electrode joiner 623 is formed above a SiO film (not illustrated) that is first dielectric film 643, and thus is electrically insulated from first source electrode 631. Moreover, the width (the depth direction in plan view) of gate electrode joiner 623 is about 3 µm, and is designed greater than first gate electrode 621 and second gate electrode 622 both of which have lengths of about 1 µm. With this design, it is possible to perform a wiring process using vias and plugs which is difficult to perform above gate electrodes. The above-mentioned wiring process will be hereinafter described. In the same manner as has been described above, third gate electrode 625 and fourth gate electrode 626 are combined by second gate electrode joiner 627 near the center portion between third gate electrode 625 and fourth gate electrode 626 as illustrated in FIG. 13B.

A SiO film as second dielectric film 647 is formed above first gate electrode 621, second gate electrode 622, first gate electrode joiner 623, third gate electrode 625, fourth gate electrode 626, second gate electrode joiner 627, first source electrode 631, and second source electrode 633. Second dielectric film 647 is to be designed to have a thickness that can prevent an occurrence of a dielectric breakdown between the first source and the second source in a high voltage double gate transistor. For example, when second dielectric film 647 is used as a SiO film, the thickness of second dielectric film 647 is to range from 2 µm to 3 µm in a double gate transistor withstanding 600 V. In this case, vias 681 above first source electrode 631, via 671 above first gate electrode joiner 623, vias 651 above second source electrode 633, and via 661 above second gate electrode joiner 627 are formed using a usual photolithography technique and a technique for dry etching second dielectric film 647 and first dielectric film 643, if first source electrode 631, first gate electrode joiner 623, second gate electrode joiner 627, and second source electrode 633 each have a width of about 3 µm. Plugs 683, 673, 653, and 663 that fill the above-described vias are then formed. Plugs 683, 673, 653, and 663 each have a portion in contact with second dielectric film 647 where a TiN film is formed as a barrier layer, and tungsten (W) is used for these plugs. Plugs 683 are connected with first source electrode lead wiring 685, plug 673 is connected with first gate electrode lead wiring 675, plugs 653 are connected with second source electrode lead wiring 655, and plug 663 is connected with second gate electrode lead wiring 665.

In this embodiment, first gate electrode 621 and second gate electrode 622 are connected by first gate electrode joiner 623 at the center portion between first gate electrode 621 and second gate electrode 622. Then, a gate wiring is formed by forming via 671 in first gate electrode joiner 623. In addition, third gate electrode 625 and fourth gate electrode 626 are connected by second gate electrode joiner 627 at the center portion between third gate electrode 625 and fourth gate electrode 626. Then, a gate wiring is formed by forming via 671 and via 661 in first gate electrode joiner 623 and second gate electrode joiner 627, respectively. Accordingly, the resistance of the gate wirings is significantly reduced as compared to the case where a gate wiring is formed from end portions of gate electrodes. Moreover, the gate wirings are formed, not above isolation area 610, but above active area 609. This also results in no increase in the chip area.

Note that, as in Variation 1 of Embodiment 1, cross-sectional shapes of side faces of first source electrode 631 and second source electrode 633 which are in contact with first dielectric film 643 may be forward tapered in nitride semiconductor device 620 according to the embodiment. With this forward tapered shape, coverage of the side faces of first source electrode 631 and second source electrode 633 by first dielectric film 643 improves, and thus a void (gap) and a seam (joint) are less likely to be created. This, as a result, yields an advantageous effect of reducing the likelihood of an occurrence of a dielectric breakdown in first dielectric film 643, even if a reverse bias voltage of several tens of V is applied between first source electrode 631 and first gate electrode joiner 623 and between second source electrode 633 and second gate electrode joiner 627.

Note that, as in Variation 2 of Embodiment 1, a low-resistance metal layer that serves as a source field plate electrode may be provided above first source electrode 631 and second source electrode 633 in nitride semiconductor device 620 according to the embodiment.

Note that, as in Embodiment 2, the configuration illustrated in FIG. 12 may be repeatedly formed in the X direction, and the following pads may be formed in nitride semiconductor device 620 according to the embodiment: a first source pad in first source electrode lead wiring 685, a second source pad in second source electrode lead wiring 655, a first gate pad in first gate electrode lead wiring 675, and a second gate pad in second gate electrode lead wiring 665.

Note that, as in the variation of Embodiment 2, a protection diode may be interposed between the first source and the first gate or between the second source and the second gate in nitride semiconductor device 620 according to the embodiment.

Note that, as in Embodiment 3, a first source pad, a second source pad, a first gate pad, and a second gate pad may be formed in nitride semiconductor layer 620 using a wiring technique for a second layer.

As has been described above, the nitride semiconductor device according to Embodiment 4 includes: a base; a semiconductor stacked structure including a plurality of nitride semiconductor layers above the base; a first active area surrounded by an isolation area on a top surface side of the semiconductor stacked structure; and the following electrodes above the first active area: (i) a first source electrode; and (ii) a first gate electrode and a second gate electrode, one on either side of and spaced from the first source electrode in a first direction in plan view; and (iii) a second source electrode; and (iv) a third gate electrode and a fourth gate electrode, one on either side of and spaced from the second source electrode in the first direction in the plan view. The first source electrode, the first gate electrode, the second gate electrode, the second source electrode, the third gate electrode, and the fourth gate electrode each include a finger-shaped portion extending in a second direction perpendicular to the first direction in the plan view. A first dielectric film is disposed above the first source electrode and the second source electrode. The first gate electrode and the second gate electrode are electrically connected by a first gate electrode joiner disposed above the first dielectric film.

The third gate electrode and the fourth gate electrode are electrically connected by a second gate electrode joiner disposed above the first dielectric film.

According to the above, wirings of the gate electrodes are formed inside the first active area in plan view to shorten lengths of the wirings, and this may be able to reduce the resistance of the gate wirings. This, as a result, yields an advantageous effect of being suitable for fast switching operation. In addition, the formation of the wirings of the gate electrodes inside the active area in plan view yields an advantageous effect of reducing an area of a chip as a nitride semiconductor device.

For example, the first gate electrode, the second gate electrode, the first gate electrode joiner, the third gate electrode, the fourth gate electrode, and the second gate electrode joiner may include the same metal layer.

The above yields an advantageous effect of not increasing the number of manufacturing processes in the formation of the first gate electrode, the second gate electrode, the first gate electrode joiner, the third gate electrode, the fourth gate electrode, and the second gate electrode joiner.

For example, the first gate electrode joiner may have a width greater than a length of the first gate electrode and a length of the second gate electrode, and the second gate electrode joiner may have a width greater than a length of the third gate electrode and a length of the fourth gate electrode.

According to the above, wirings each using a via and a plug can be formed for the gate electrode joiners, and thus the chip area can be reduced.

For example, a portion of a side surface of the first source electrode which is in contact with the first dielectric film may be forward tapered, and a portion of a side surface of the second source electrode which is in contact with the first dielectric film may be forward tapered.

According to the above, coverage of side faces of the first and the second source electrodes by the first dielectric film improves, and thus the creation of a void (gap) and a seam (joint) is prevented.

This, as a result, yields an advantageous effect of reducing the likelihood of an occurrence of a dielectric breakdown in the first dielectric film, even if a reverse bias voltage (e.g., several tens of V) is applied between a source electrode and a gate electrode joiner.

The nitride semiconductor device according to one or more aspects has been hereinbefore described based on the embodiments; however, the present disclosure is not limited to these embodiments. The scope of the one or more aspects of the present disclosure may encompass embodiments as a result of making, to the embodiments, various modifications that may be conceived by those skilled in the art and combining elements in different embodiments, as long as the resultant embodiments do not depart from the scope of the present disclosure.

INDUSTRIAL APPLICABILITY

The nitride semiconductor device according to the present disclosure can be used as a transistor for switching whose gate wiring has low resistance.

REFERENCE SIGNS LIST

1 Si base
2 buffer layer
3 GaN channel layer
4 AlGaN barrier layer 5, 6, 105, 106, 405 p-type GaN layer
8, 208, 308, 408, 508 first active area
8A, 208A, 308A, 408A, 508A, 609A ion implanted area
   boundary
9, 209, 309, 409, 509 isolation area
10, 110, 210, 310, 410, 510, 620 semiconductor device
11, 111, 211, 311, 511 source electrode
21, 121, 221, 521 first gate electrode
23, 123, 223, 523 second gate electrode
25, 125, 225, 325, 525 gate electrode joiner
31, 33, 231, 233, 331, 531, 533 drain electrode
41, 141, 241, 441 SiN film
43, 143, 243, 443 first dielectric film (SiO film)
47, 247, 447 second dielectric film (SiO film)
51, 251, 351, 551 via above source electrode
53, 253 plug
55, 255, 355, 555 first source lead wiring
61, 261, 361, 561 via above gate electrode joiner
63, 263 plug
65, 265, 365, 565 first gate lead wiring
71, 271, 371, 571 via above drain electrode
73, 273 plug
75, 275, 375, 575 first drain lead wiring
245 SiO film (field plate film)
281, 283, 287 low-resistance metal layer
285 low-resistance metal layer (source field plate elec-
   trode)
391 source pad
391A source pad opening
393 gate pad
393A gate pad opening
395 drain pad
395A drain pad opening
405 p-type layer
411 dummy electrode
413 cathode electrode
425 anode electrode
451 via
453 plug
455 cathode electrode lead wiring
461 via
463 plug
465 anode electrode lead wiring
481 anode-to-source wiring
483 anode-to-cathode wiring
485 cathode-to-gate wiring
490 p-n diode
492 protection diode
498 second active area
581 via above first source lead wiring
582, 584, 586 plug
583 via above first gate lead wiring
585 via above first drain lead wiring
587 second source lead wiring
588 second gate lead wiring
589 second drain lead wiring
591 source pad
591A source pad opening
593 gate pad
593A gate pad opening
595 drain pad
595A drain pad opening
605, 606, 607, 608 p-type GaN layer
609 active area
610 isolation area
621 first gate electrode
622 second gate electrode 623 first gate electrode joiner
625 third gate electrode
626 fourth gate electrode
627 second gate electrode joiner
631 first source electrode
633 second source electrode
641 SiN film
643 first dielectric film (SiO film)
647 second dielectric film (SiO film)
651 via above second source electrode
653 plug
655 second source electrode lead wiring
661 via above second gate electrode joiner
663 plug
665 second gate electrode lead wiring
671 via above first gate electrode joiner
673 plug
675 first gate electrode lead wiring
681 via above first source electrode
683 plug
685 first source electrode lead wiring

The invention claimed is:

1. A nitride semiconductor device comprising:
a base;
a semiconductor stacked structure above the base, the
   semiconductor stacked structure including a plurality
   of nitride semiconductor layers;
a first active area on a top surface side of the semicon-
   ductor stacked structure, the first active area being
   surrounded by an isolation area; and
the following electrodes above the first active area: (i) a
   source electrode; (ii) a first gate electrode and a second
   gate electrode, one on either side of and spaced from
   the source electrode in a first direction in plan view; and
   (iii) at least one drain electrode located in a direction
   opposite the source electrode relative to the first gate
   electrode or the second gate electrode, wherein
the source electrode, the first gate electrode, the second
   gate electrode, and the at least one drain electrode each
   include a finger-shaped portion extending in a second
   direction perpendicular to the first direction in the plan
   view,
a first dielectric film is disposed above the source elec-
   trode,
the first gate electrode and the second gate electrode are
   electrically connected by a gate electrode joiner dis-
   posed above the first dielectric film, and
the first gate electrode, the second gate electrode, and the
   gate electrode joiner include the same metal layer.
2. The nitride semiconductor device according to claim 1,
wherein
   the gate electrode joiner has a width greater than a length
   of the first gate electrode and a length of the second
   gate electrode.
3. The nitride semiconductor device according to claim 1,
wherein
   a portion of a side surface of the source electrode is
   forward tapered, the portion being in contact with the
   first dielectric film.
4. The nitride semiconductor device according to claim 1,
comprising:
   a second active area above the base, the second active area
   being surrounded by the isolation area, wherein
   a protection diode in which a plurality of diodes are
   connected in series is disposed, the plurality of diodes
   being disposed in the second active area, the protection diode includes an anode that is electrically connected to the source electrode, the protection diode includes a cathode that is electrically connected to the gate electrode joiner, and a rising voltage of a current that flows from the anode of the protection diode to the cathode of the protection diode is lower than a breakdown voltage of the first dielectric film.

5. The nitride semiconductor device according to claim 1, wherein a low-resistance metal layer is disposed above each of the source electrode except for a portion below the gate electrode joiner and the at least one drain electrode.

6. The nitride semiconductor device according to claim 5, wherein the low-resistance metal layer disposed above the source electrode is a source field plate electrode that extends in a direction toward the at least one drain electrode over the first gate electrode and the second gate electrode.

7. The nitride semiconductor device according to claim 1, wherein the source electrode, the first gate electrode, the second gate electrode, the gate electrode joiner, and the at least one drain electrode are repeatedly disposed in the first direction, a second dielectric film is disposed above a plurality of gate electrode joiners each of which is the gate electrode joiner, and the nitride semiconductor device comprises a first gate lead wiring that electrically connects the plurality of gate electrode joiners through vias in the second dielectric film, and extends in the first direction.

8. The nitride semiconductor device according to claim 7, wherein the second dielectric film is also disposed above the source electrode, the first gate electrode, the second gate electrode, and the at least one drain electrode which are repeatedly disposed in the first direction, and the nitride semiconductor device comprises a first source lead wiring and a first drain lead wiring disposed with the first gate lead wiring therebetween, the first source lead wiring electrically connecting a plurality of source electrodes each of which is the source electrode through vias in the second dielectric film and extending in the first direction, the first drain lead wiring electrically connecting a plurality of drain electrodes each of which is the at least one drain electrode through vias in the second dielectric film and extending in the first direction.

9. The nitride semiconductor device according to claim 8, wherein the first gate lead wiring, the first source lead wiring, and the first drain lead wiring include a same metal wiring layer.

10. The nitride semiconductor device according to claim 8, comprising:

a gate pad disposed in a part of the first gate lead wiring;

a source pad disposed in a part of the first source lead wiring; and a drain pad disposed in a part of the first drain lead wiring.

11. The nitride semiconductor device according to claim 9, wherein the first gate lead wiring, the first source lead wiring, and the first drain lead wiring comprise a plurality of first gate lead wirings, a plurality of first source lead wirings, and a plurality of first drain lead wirings, respectively, a third dielectric film is disposed above the plurality of first gate lead wirings, the plurality of first source lead wirings, and the plurality of first drain lead wirings, and the nitride semiconductor device comprises:

a second gate lead wiring that electrically connects the plurality of first gate lead wirings through vias in the third dielectric film, and extends in the second direction;

a second source lead wiring that electrically connects the plurality of first source lead wirings through vias in the third dielectric film, and extends in the second direction; and a second drain lead wiring that electrically connects the plurality of first drain wirings through vias in the third dielectric film, and extends in the second direction.

12. The nitride semiconductor device according to claim 11, wherein each of the plurality of first source lead wirings is interposed between first gate lead wirings included in the plurality of first gate lead wirings, and each of the plurality of first drain lead wirings is interposed between first gate lead wirings included in the plurality of first gate wirings.

13. The nitride semiconductor device according to claim 11, wherein a distance between each of the plurality of first drain lead wirings and a corresponding one of the plurality of first gate lead wirings is greater than a distance between a corresponding one of the plurality of first source lead wirings and the corresponding one of the plurality of first gate lead wirings.

14. The nitride semiconductor device according to claim 11, wherein the second gate lead wiring, the second source lead wiring, and the second drain lead wiring include a same metal wiring layer.

15. The nitride semiconductor device according to claim 11, comprising:

a gate pad disposed in a part of the second gate lead wiring;

a source pad disposed in a part of the second source lead wiring; and a drain pad disposed in a part of the second drain lead wiring.

16. The nitride semiconductor device according to claim 1, wherein the gate electrode joiner is simultaneously formed with the first gate electrode and the second gate electrode.

* * * * *